(12) United States Patent
Miyazaki et al.

(10) Patent No.: US 8,229,021 B2
(45) Date of Patent: Jul. 24, 2012

(54) DATA TRANSMISSION SYSTEM AND DATA TRANSMISSION METHOD

(75) Inventors: Noriaki Miyazaki, Fujimino (JP); Toshinori Suzuki, Fujimino (JP)

(73) Assignee: KDDI Corporation, Tokyo (JP)

( * ) Notice: Subject to any disclaimer, the term of this patent is extended or adjusted under 35 U.S.C. 154(b) by 1152 days.

(21) Appl. No.: 11/991,510

(22) PCT Filed: Sep. 6, 2006

(86) PCT No.: PCT/JP2006/317642
§ 371 (c)(1), (2), (4) Date: Mar. 5, 2008

(87) PCT Pub. No.: WO2007/029734
PCT Pub. Date: Mar. 15, 2007

(65) Prior Publication Data
US 2009/0122903 A1 May 14, 2009

(30) Foreign Application Priority Data

Sep. 6, 2005 (JP) ................................ 2005-257844
Oct. 24, 2005 (JP) ................................ 2005-308965
Oct. 24, 2005 (JP) ................................ 2005-308966

(51) Int. Cl.
*H04L 25/34* (2006.01)

(52) U.S. Cl. ........ 375/286; 375/147; 375/260; 375/295; 375/224; 375/298; 375/267; 375/265; 375/341; 375/346

(58) Field of Classification Search .................. 375/286, 375/147, 260, 295, 224, 267, 296, 265, 341, 375/346; 714/748, 751, 755, 758, 776, 790, 714/794
See application file for complete search history.

(56) References Cited

U.S. PATENT DOCUMENTS

| | | | |
|---|---|---|---|
| 7,496,079 B2 * | 2/2009 | Kim et al. ..................... | 370/342 |
| 2004/0019845 A1 | 1/2004 | Eroz et al. | |
| 2005/0047522 A1 * | 3/2005 | Kim et al. ..................... | 375/298 |
| 2005/0152408 A1 * | 7/2005 | Jeong et al. .................. | 370/529 |
| 2005/0180363 A1 | 8/2005 | Yano et al. | |
| 2005/0216821 A1 | 9/2005 | Harada | |
| 2006/0188044 A1 * | 8/2006 | Wang et al. ................... | 375/347 |

FOREIGN PATENT DOCUMENTS

| | | |
|---|---|---|
| JP | H06-006399 | 1/1994 |
| JP | 2000-201132 A | 7/2000 |
| JP | 2002-050969 | 2/2002 |
| JP | 2004-064756 | 2/2004 |
| JP | 2005-051469 A | 2/2005 |
| JP | 2005-229319 | 8/2005 |

(Continued)

OTHER PUBLICATIONS

Office Action issued on Japanese Patent Application No. 2007-534448 with an English Translation Thereof.

(Continued)

*Primary Examiner* — Dhaval Patel
(74) *Attorney, Agent, or Firm* — Edwards Wildman Palmer LLP; David G. Conlin; David A. Tucker

(57) ABSTRACT

The present invention maps coded bits that have been output from a low density parity check coder 11 onto specific bit positions on a 16 QAM constellation diagram in accordance with a column weighting of the coded bits.

6 Claims, 30 Drawing Sheets

FOREIGN PATENT DOCUMENTS

| | | |
|---|---|---|
| JP | 2005-277784 | 10/2005 |
| JP | 2006-006399 A | 1/2006 |
| JP | 2007-515122 T | 6/2007 |
| WO | WO 2005/060141 A1 | 6/2005 |

OTHER PUBLICATIONS

Office Action issued on Japanese Patent Application No. 2007-534448, on Mar. 1, 2011, with an English translation thereof.

3GPP2, C.S0024 Version 4.0, "cdma2000 High Rate Packet Data Air Interface Specification," Oct. 2002.

Tadashi Wadayama, "Introduction to Low Density Check Codes and the Sum-Product Algorithm," Technical Report of IEICE, pp. 1-9 (Cited in specification as "Low Density Parity Check Codes and Decoding Method for These," Shingaku Giho, MR2001-83, Dec. 2001.).

Chen Zheng (Cited in specification as Jin Jeon) and Toshinori Suzuki, "A Proposal of Rate-Compatible Low-Density Parity-Check Code for Lan Mobile Radio," Shingaku Giho, IT2005-5, pp. 25-30, May 2005.

Shigeru Uchida, Wataru Matsumoto, Akira Otsuka, and Keishi Murakami, Shingaku Tsuso, "A Study on Construction Method of Low-Density Parity-Check Codes for M-ary QAM" (Cited in specification as "Examination of LDPC Code Construction Methods Suitable for Multilevel Modulation," B-5-59, Sep. 2004.).

M.C. Davey and D. MacKay, "Low-Density Parity Check Codes Over GF(q)," IEEE Comun. Lett., vol. 2, No. 6, pp. 165-167, Jun. 1998.

T. Suzuki, N. Miyazaki, Y. Hatakawa, "A Proposal of Twin Turbo Detector and Its Evaluation for M-QAM OFDM," Shingaku Tsuso, B-5-6, pp. 405-406. Sep. 2005.

N. Miyazaki, C. Zheng, T. Suzuki, and H. Shinonaga, "A Study on Symbol and Sub-Carrier Mapping Techniques for MC-CDMA based on LDPC Code with Progressively Increased Column-Weight," Proc. PIMRC 2005, B01-4, pp. 1-5, Sep. 2005.

N. Miyazaki and T. Suzuki, "A Study on Forward Link Capacity in MC-CDMA Cellular System with MMSEC Receiver," IEICE Trans. Commun., vol. E88-B, No. 2, pp. 585-593, Feb. 2005.

Y. Harada, D. Takeda, H. Shogi, "Hi Seisoku LDPC Fugo o Mochiita Fugoka Hencho Hoshiki ni Kansuru Ichi Kento (B-5-60)," 2004 Nen IEICE Communications Society Conference, Koen Ronbunshu 1, Sep. 21, 2004, p. 394.

\* cited by examiner

FIG. 2

$$H = \begin{pmatrix}
1 & 1 & 0 & 0 & 1 & 0 & 0 & 0 & 0 & 0 & 0 & 0 & 0 & 0 & 1 & 0 & 0 & 0 & 1 & 0 & 1 & 0 & 1 & 0 & 1 & 1 & 0 & 1 & 1 & 0 \\
0 & 1 & 1 & 0 & 0 & 1 & 0 & 0 & 0 & 0 & 0 & 0 & 0 & 0 & 0 & 1 & 1 & 1 & 0 & 1 & 0 & 1 & 0 & 1 & 0 & 0 & 1 & 0 & 1 & 0 \\
0 & 0 & 1 & 1 & 0 & 0 & 1 & 0 & 0 & 0 & 0 & 0 & 0 & 0 & 1 & 0 & 0 & 0 & 1 & 1 & 0 & 1 & 1 & 0 & 1 & 0 & 1 & 1 & 0 & 0 \\
0 & 0 & 0 & 1 & 1 & 0 & 0 & 1 & 0 & 0 & 0 & 0 & 0 & 0 & 0 & 1 & 1 & 0 & 0 & 0 & 1 & 0 & 0 & 1 & 0 & 1 & 0 & 1 & 0 & 0 \\
1 & 0 & 0 & 0 & 0 & 1 & 0 & 0 & 1 & 0 & 0 & 0 & 0 & 0 & 1 & 0 & 0 & 1 & 1 & 0 & 0 & 0 & 1 & 0 & 1 & 0 & 1 & 0 & 1 & 0 \\
0 & 1 & 0 & 0 & 0 & 0 & 1 & 0 & 0 & 1 & 0 & 0 & 0 & 0 & 0 & 1 & 1 & 0 & 0 & 1 & 0 & 1 & 0 & 0 & 0 & 1 & 0 & 1 & 0 & 1 \\
0 & 0 & 1 & 0 & 0 & 0 & 0 & 1 & 0 & 0 & 1 & 0 & 0 & 0 & 1 & 0 & 0 & 1 & 0 & 0 & 1 & 0 & 0 & 1 & 1 & 0 & 1 & 0 & 0 & 1 \\
0 & 0 & 0 & 1 & 0 & 0 & 0 & 0 & 1 & 0 & 0 & 1 & 0 & 0 & 0 & 0 & 1 & 0 & 1 & 1 & 0 & 0 & 1 & 1 & 0 & 1 & 0 & 0 & 1 & 1 \\
0 & 0 & 0 & 0 & 1 & 0 & 0 & 0 & 0 & 1 & 0 & 0 & 1 & 0 & 1 & 1 & 0 & 0 & 0 & 1 & 1 & 1 & 0 & 0 & 1 & 0 & 0 & 1 & 1 & 0 \\
0 & 0 & 0 & 0 & 0 & 1 & 1 & 0 & 0 & 0 & 1 & 0 & 0 & 1 & 0 & 0 & 0 & 1 & 0 & 0 & 1 & 0 & 1 & 1 & 0 & 1 & 1 & 0 & 0 & 0
\end{pmatrix}$$

Column weighting: 2 2 2 2 2 2 2 3 3 3 3 3 3 3 4 4 4 4 4 4 5 5 5

Row weighting: 7 6 6 6 7 7 7 6 7 6

Correspond to parity bits | Correspond to information bits

| NUMBER OF INFORMATION BITS | 4096 |
|---|---|
| ERROR CORRECTION CODE | LOW DENSITY PARITY CHECK CODE FROM NON-PATENT DOCUMENT 3 |
| CODE RATE | 1/2 |
| DECODING ALGORITHM | SUM PRODUCT ALGORITHM |
| MAXIMUM DECODING ITERATION | 100 |
| MODULATION SYSTEM | 16QAM |
| TRANSMISSION PATH | ADDITIVE WHITE GAUSS NOISE TRANSMISSION PATH |

DATA TRANSMISSION SYSTEM AND DATA TRANSMISSION METHOD

TECHNICAL FIELD

The present invention relates to a data transmission system and a data transmission method.

Priority is claimed on Japanese Patent Application No. 2005-257844, filed Sep. 6, 2005, and on Japanese Patent Application Nos. 2005-308965 and 2005-308966, filed Oct. 24, 2005, the contents of which are incorporated herein by reference.

TECHNICAL BACKGROUND

In recent years, in radio communications systems, achieving a higher frequency utilization efficiency has become a significant problem. One means of solving this problem is by using error correcting code, which has excellent correction capabilities, and multilevel modulation. For example, in an existing cellular system such as the cdma 2000 HRPD (High Rate Packet Data) system disclosed in Non-patent document 1, an improvement in frequency utilization efficiency is achieved by turbo coding the information bits and using multilevel modulation such as 16 QAM (Quadrature Amplitude Modulation).

Moreover, in Non-patent document 2, low-density parity check codes are disclosed as codes that have even greater correction capabilities than turbo coding. Low-density parity check codes are divided into regular codes in which the weighting distribution of the check matrix is uniform, and irregular codes in which the weighting distribution varies. It is generally considered that irregular codes have greater correction capabilities. For example, in Non-patent document 3, irregular low-density parity check codes that are suitable for puncturing are disclosed. The irregular low-density parity check codes in Non-patent document 3 are binary low-density parity check codes designed as a finite field having an order of 2, and are characterized by the fact that any of the information bit column weightings are larger than a parity bit column weighting. Moreover, in Non-patent document 4, a construction method for binary low-density parity check codes suitable for 16QAM is disclosed as a code construction method suitable for multilevel modulation transmission technology. Moreover, in Non-patent document 5, multilevel modulation technology is disclosed as a coding modulation system which is a combination of error correcting code and multilevel modulation, and which is representative of a coding modulation system in low-density parity check codes, and which employs binary low-density parity check codes that are designed such that the order is a finite field larger than 2.

Moreover, in Non-patent document 6, demodulation technology which is based on turbo coding known as 'twin turbo decoding' has been proposed as a demodulation method for improving the correction capability of turbo code. FIG. 29 is a block diagram showing the structure of a twin turbo decoder 201. Here, in a known turbo coder, an information bit vector is taken as $X_a$, a parity bit vector created by an element coder 1 is taken as $X_b$, and a parity bit vector created by an element coder 2 is taken as $X_c$. In a typical turbo decoder, efficient MAP (Maximum A-Posteriori Probability) decoding is achieved by providing a stochastic propagation feedback loop in which two element decoders are interlinked by a bit interleaver, and a-posteriori values of the bits that have been updated in each element decoder are fed back as a-priori values of the other element decoder. In contrast, in the twin turbo decoder 201, by providing a stochastic coupling feedback loop (i.e., in FIG. 29 the path by which a-posteriori values ($X_a$, $X_c$) after being output from the element decoder 2_211 are input via the turbo deinterleaver 213 into a demodulator 1_210, and the path by which a-posteriori values ($X_a$, $X_b$) after being output from the element decoder 1_211 are input into a demodulator 2_210) in addition to the stochastic propagation feedback loop thereof (i.e., the path in FIG. 29 by which an exterior value ($X_a$) after being output from an element decoder 2_211 is input as an a-priori value ($X_a$) into an element decoder 1_211 via a turbo deinterleaver 213), the likelihood coupling probability of each bit making up the multilevel modulation symbol is calculated, thereby improving the error correction capability of the turbo code.

For example, in 4ASK (Amplitude Shift Keying) modulation, if a relationship is obtained for a distance between a transmission signal point and a reception signal point shown in FIG. 30, then the communication path value update processing in the demodulators 1_210 and 2_210 shown in FIG. 29 can be expressed by Formulas (1) and (2).

[Formula 1]

$$L_c(b(0)) = \min\{\gamma\delta_C - (-2b(1)+1)L_p(b(1))/2, \gamma\delta_D - (-2b(1)+1)L_p(b(1))/2\} - \min\{\gamma\delta_B - (-2b(1)+1)L_P(b(1))/2, \gamma\delta_A - (-2b(1)+1)L_p(b(1))/2\}$$
$$= \min\{\gamma\delta_C + L_p(b(1))/2, \gamma\delta_D - L_P(b(1))/2\} - \min\{\gamma\delta_B + L_p(b(1))/2, \gamma\delta_A - L_P(b(1))/2\} \quad (1)$$

[Formula 2]

$$L_c(b(1)) = \min\{\gamma\delta_C - (-2b(0)+1)L_p(b(0))/2, \gamma\delta_B - (-2b(0)+1)L_p(b(0))/2\} - \min\{\gamma\delta_D - (-2b(0)+1)L_p(b(0))/2, \gamma\delta_A - (-2b(0)+1)L_p(b(0))/2\}$$
$$= \min\{\gamma\delta_C + L_p(b(0))/2, \gamma\delta_B - L_p(b(0))/2\} - \min\{\gamma\delta_D + L_p(b(0))/2, \gamma\delta_A - L_p(b(0))/2\} \quad (2)$$

Wherein $L_c(b(0))$ and $L_c(b(1))$ represent communication path values of bits b (0) and b (1), $L_p(b(0))$ and $L_p(b(1))$ represent a-priori values of bits b (0) and b (1), and γ represents a signal-to-noise power ratio.

The communication path value of the bit b (0) is updated by the a-posteriori value of its pair bit (b) 1. The communication path value of the other bit b (1) is updated by the a-posteriori value of its pair bit (b) 0.

Moreover, according to Non-patent document 7, it has been reported that in multilevel modulation the error rate varies depending on bit position of the modulation symbols.

Moreover, in new-generation mobile communication systems, it has been observed that multi-carrier transmission systems are becoming prevalent over single carrier transmission systems. Representative multi-carrier transmission systems include OFDM (Orthogonal Frequency Division Multiplexing) systems and MC-CDMA (Multi-carrier-Code Division Multiple Access) systems. According to an MC-DCMA system, by spreading modulation symbols over a plurality of sub-carriers, multiplexing them, and then transmitting them, a frequency diversity effect is obtained. In addition to this, inter-cell interference can be uniformized. However, it is known that, because inter-code interference is generated in the frequency selective transmission path, there is a deterioration in the signal-to-noise and signal-to-interference-energy ratios after back-diffusion (for example, see Non-patent document 8). Therefore, investigations are being made into demodulation methods that estimate a maximum likelihood without any back-diffusion. Using as an example a forward link that performs time division multiplexing on a pilot signal and a data signal and then transmits these, a description is given below of an MC-CDMA system that estimates a maximum likelihood without performing back-diffusion.

FIG. 31 is a block diagram showing the structure of an MC-CDMA data transmission system that estimates a maximum likelihood without performing back-diffusion. Here, in order to simplify the explanation, it is assumed that all the information bits are transmitted using a single MC-CDMA symbol. Firstly, in a transmitter 1000a, a modulator 1040 modulates information bits so as to obtain an $n_m$-th modulation symbol $M_t(n_m)$. Next, for the diffusion, the modulation symbol Mt (Nm) is allocated to an $i_d$-th frequency band that has a bandwidth equivalent to the bandwidth occupied by the diffusion code, and is converted into a parallel signal by a serial/parallel converter 1050. Next, the modulation symbol that has been allocated to the $i_d$-th frequency band is diffused by a different diffusion symbol for each modulation symbol by a diffuser 1060, and is multiplexed to become a data sub-carrier. The modulation symbols have the relationship shown in Formula (3).

[Formula 3]

$$\hat{M}_t(i_d, \hat{n}_m) = \hat{M}_t((n_m - n_m \bmod M_w)/M_w, n_m \bmod M_w) \quad (3)$$
$$= M_t(n_m) \begin{cases} 0 \leq n_m \leq (M_w/N_w)N_d - 1 \\ 0 \leq \hat{n}_m \leq M_w - 1 \\ 0 \leq i_d \leq N_d/N_w - 1 \end{cases}$$

wherein $\hat{M}_t(i_d, \hat{n}_m)$ is the $\hat{n}_m$-th modulation symbol that has been allocated to the $i_d$th frequency band, $N_w$ is the diffusivity, $M_w$ is the number of code-multiplexing, and $N_d$ is the data sub-carrier number.

As a result, Formula (4) is obtained.

[Formula 4]

$$\hat{D}_t(i_d, \hat{k}_d) = \frac{1}{\sqrt{M_w}} \sum_{\hat{n}=0}^{M_w-1} \hat{M}_t(i_d, \hat{n}_m) c_w(\hat{n}_m, \hat{k}_d) \quad (4)$$

wherein $\hat{D}_t(i_d, \hat{k}_d)$ is the $\hat{k}_d$-th sub-carrier of the $i_d$-th frequency band, and $c_w(\hat{n}_m, \hat{k}_d)$ is the diffusion code of the $\hat{n}_m$-th modulation symbol. In addition, $0 \leq \hat{k}_d \leq N_w - 1$.

Generally, in an MC-CDMA system, orthogonal code such as Walsh's code or the like is used as the diffusion code, and the orthogonal code has characteristics such as those shown in Formulas (5) and (6) below.

[Formula 5]

$$c_w(m, k) = 1 \text{ or } -1 \quad (5)$$

[Formula 6]

$$\sum_{k_d=0}^{N_w-1} c_w(m, k) c_w(n, k) = \begin{cases} N_w & \text{for } m = n \\ 0 & \text{for } m \neq n \end{cases} \quad (6)$$

As a result, the correlation values between the same codes form the serial length thereof, and the correlation values between different codes becomes [0].

Next, the data sub-carrier is converted into a signal of a time domain by inverse Fourier transform performed by an inverse Fourier transformer 1070, and is then converted into a serial signal by a parallel/serial converter 1080. A cyclic prefix is then inserted by a cyclic prefix inserter 1090, and it is then further time multiplexed with a pilot signal by a time multiplexer 1100, and is transmitted from the transmitter 1000a.

After signals transmitted from the transmitter 1000a have been affected by the frequency selectivity of a frequency selective transmission path 3010, and have also been affected by noise from an additive white Gaussian noise transmission path 3020, they are received by a receiver 2000a. In the receiver 2000a, the received signal is separated into the pilot signal and data signal by a time division demultiplexer 2010, and the cyclic prefixes are removed therefrom respectively by cyclic prefix removers 2020 and 2090. Next, the signals are converted into parallel signals by serial/parallel converters 2030 and 2100, and are then converted respectively into a data sub-carrier and a pilot sub-carrier by Fourier transform performed by Fourier transformers 2040 and 2110. Transmission path variations are then estimated from the pilot sub-carrier by a transmission path estimator 2120, and equalization (i.e., phase rotation compensation) of the data sub-carrier is performed by an equalizer 2050. The equalized data sub-carrier is expressed by Formula (7).

[Formula 7]

$$\hat{D}_{eql}(i_d, \hat{k}_d) = \frac{\hat{H}_{est}^*(i_d, \hat{k}_d)}{|\hat{H}_{est}(i_d, \hat{k}_d)|} \hat{D}_r(i_d, \hat{k}_d) \quad (7)$$

wherein $\hat{D}_r(i_d, \hat{k}_d)$ is the reception data sub-carrier, $\hat{D}_{eql}(i_d, \hat{k}_d)$ is the data sub-carrier after equalization, and $\hat{H}_{est}(i_d, \hat{k}_d)$ is the transmission path estimation value. In addition, $\hat{H}(i_d, \hat{k}_d)$ is the frequency selectivity from the frequency selective transmission path 3010, $N_0$ is the noise power density from the additive white Gaussian noise transmission path 3020, and * shows a complex conjugate.

Next, the equalized data sub-carrier is converted into a serial signal by a parallel/serial converter 2060, and is then converted into a maximum likelihood estimation symbol by a maximum likelihood estimation symbol creator 2070. For example, when the diffusivity is 2, the symbol for maximum likelihood estimation is shown by Formula (8).

[Formula 8]

$$\begin{cases} \hat{M}_{rml}(i_d, 2\hat{n}) = \text{Im}[\hat{D}_{eql}(i_d, 2\hat{n})] + j\text{Im}[\hat{D}_{eql}(i_d, 2\hat{n}+1)] \\ \hat{M}_{rml}(i_d, 2\hat{n}+1) = \text{Re}[\hat{D}_{eql}(i_d, 2\hat{n})] + j\text{Re}[\hat{D}_{eql}(i_d, 2\hat{n}+1)] \end{cases} \quad (8)$$

wherein $\hat{M}_{rml}(i_d, \hat{n}_{ml})$ is the $\hat{n}_{ml}$-th symbol for maximum likelihood estimation. In addition, $0 \leq \hat{n}_{ml} \leq N_w - 1$ and $0 \leq \hat{n}_{ml} \leq N_w/2 - 1$.

Next, a demodulator 2080a obtains a reception modulation symbol $M_r(n_m)$ using Formula (9).

[Formula 9]

$$M_r(n_m) = \hat{M}_{rml}(\hat{n}_{ml} + i_d M_w) = \hat{M}_r(i_d, \hat{n}_{ml}) \quad (9)$$

The processing to create the symbol for maximum likelihood estimation when the diffusivity is 2 is shown in FIG. 32.

Moreover, according to Non-patent document 4, it has been reported that in multilevel modulation the error rate differs depending on the bit position of the modulation symbol.

[Non-patent document 1] 3GPP2, C.S0024 Version 4.0, "cdma2000 High Rate Packet Data Air Interface Specification," October 2002.

[Non-patent document 2] Tadashi Wadayama, "Low Density Parity Check Codes and Decoding Method For These", Shingaku Giho, MR2001-83, December 2001.

[Non-patent document 3] Jin Jeon and Toshinori Suzuki, "A Proposal of Rate-Compatible Low-Density Parity-Check Code for Land Mobile Radio", Shingaku Giho, IT20051-5, May. 2005.

[Non-patent document 4] Shigeru Uchida, Wataru Matsumoto, Akira Otsuka, and Keishi Murakami, Shingaku Tsuso, "Examination of LDPC Code Construction Methods Suitable for Multilevel Modulation", B-5-59, September, 2004.

[Non-patent document 5] M. C. Davey and D. MacKay, "Low-Density Parity Check Codes over GF(q)," IEEE Comun. Lett., Vol. 2, No. 6, pp. 165-167, June 1998.

[Non-patent document 6] T. Suzuki, N. Miyazaki, Y. Hatakawa, "A Proposal of Twin Turbo Detector and Its Evaluation for M-QAM OFDM," Shingaku Tsuso, B-5-6, September 2005.

[Non-patent document 7] N. Miyazaki, C. Zheng, T. Suzuki, and H. Shinonaga, "A Study on Symbol and Sub-Carrier Mapping Techniques for MC-CDMA based on LDPC Code with Progressively Increased Column-Weight," Proc. PIMRC 2005, B01-4, September 2005.

[Non-patent document 8] N. Miyazaki and T. Suzuki, "A Study on Forward Link Capacity in MC-CDMA Cellular System with MMSEC Receiver," IEICE Trans. Commun., Vol. E88-B, No. 2, pp. 585-593, February 2005.

DISCLOSURE OF THE INVENTION

Problems to be Solved by the Invention

However, in the above described conventional technology, the bit error rate reduction effect is not considered satisfactory, and the realizing of more reliable communication is desired.

Moreover, because the degree of importance of the coded bits varies depending on the encoding and decoding method, it is thought that the optimum bit mapping method varies depending on the encoding and decoding method. Because of this, in a data transmission system that uses turbo code, in a case in which twin turbo coding is applied, a bit mapping method for a multilevel modulation symbol that is suitable for twin turbo decoding is desired in order to reduce bit errors and achieve highly reliable communication.

Moreover, in a multi-carrier code division multiplexing transmission system that uses turbo coding, in a case in which twin turbo decoding is applied and maximum likelihood is estimated without performing back-diffusion, a bit mapping method for a multilevel modulation symbol that is suitable for twin turbo decoding and when maximum likelihood is estimated without performing back-diffusion is desired in order to reduce bit errors and achieve highly reliable communication.

In view of the above described circumstances, it is an object of the present invention to provide a data transmission system and a data transmission method that provide an increased bit error rate reduction effect and contribute to the realization of more reliable communication.

It is a further object of the present invention to provide a data transmission system and a data transmission method that, in a data transmission system that uses systematic code such as turbo code, achieves bit mapping onto a multilevel modulation symbol that is suitable for cases in which demodulation having a feedback loop for stochastic coupling such as twin turbo decoding is applied.

It is a further object of the present invention to provide a data transmission system and a data transmission method that, in a code division multiplexing transmission system that uses systematic code such as turbo code, provides bit mapping for multilevel modulation symbols that is suitable for cases in which maximum likelihood is estimated from reception signals without back-diffusion being performed and demodulation which has a feedback loop for stochastic coupling such as twin turbo decoding is applied.

Means for Solving the Problem

In order to solve the above described problems, the data transmission system according to the present invention is a data transmission system that maps coded bits onto a modulation symbol using a multilevel modulation system and then transmits these, wherein there is provided a bit mapping means that maps the coded bits onto specific bit positions on the modulation symbol in accordance with the degree of importance of the coded bits.

In the data transmission system according to the present invention, the bit mapping means maps coded bits that have a higher degree of importance onto bit positions where it is difficult for an error to occur.

In the data transmission system according to the present invention, in a constellation diagram of the multilevel modulation system, an absolute value of a difference between a least squares distance between a signal point where reception is possible and a signal point having a bit position of 0, and a least squares distance between a signal point where reception is possible and a signal point having a bit position of 1 is calculated in all signal points where reception is possible, and from a result of these calculations, the bit positions where it is difficult for an error to occur are obtained as being those where there is a higher probability of obtaining a longer least squares distance.

In the data transmission system according to the present invention, the coded bits are low density parity check codes, and column weightings of check matrixes thereof are used for the degrees of importance.

In the data transmission system according to the present invention, information bits from among the coded bits have a greater degree of importance than parity bits among the coded bits.

In the data transmission system according to the present invention, the multilevel modulation system transmits two or more bits of the in-phase components or quadrature components of a modulation symbol.

The data transmission method of the present invention is a data transmission method in which coded bits are mapped onto a modulation symbol by a multilevel modulation system and are then transmitted, wherein the coded bits are mapped onto specific bit positions on the modulation symbol in accordance with the degree of importance of the coded bits.

In the data transmission system according to the present invention, the bit mapping means has: a device that rearranges the coded bits in order of the greatest degree of importance;

and a device that places the rearranged coded bits in sequence from the bit position where it is difficult for an error to occur of the modulation symbol.

In order to solve the above described problems, the data transmission system of the present invention includes: a bit mapping means that maps coded bits, which are made up of information bits and parity bits that are each created by a different element coder from the information bits, onto a modulation symbol using a multilevel modulation system; a demodulating device that decides transmitted signals based on reception signal points from when the modulation symbol was received, and an appearance probability of the received signal points; and a device that performs decoding of error correction codes from decision results from the demodulating device, and feeds the feasibility of reception signals obtained in this decoding process back as appearance probabilities for the reception signals, wherein the bit mapping means places the information bits in bit positions of the modulation symbol where it is difficult for an error to occur.

In the data transmission system according to the present invention, the bit mapping means places groups made up of the information bits and the parity bits that have each been created by a different element coder in the same modulation symbol.

In the data transmission system according to the present invention, the bit mapping means places exactly the same number of the parity bits that have each been created by a different element coder respectively in the same modulation symbol.

In the data transmission system according to the present invention, of the parity bits that have each been created by a different element coder, the bit mapping means places those parity bits that are used first in the coding process in bit positions of the modulation symbol where it is difficult for an error to occur in advance of parity bits that are used later in the coding process.

The data transmission method of the present invention includes: a bit mapping step in which coded bits, which are made up of information bits and parity bits that are each created by a different element coder from the information bits, are mapped onto a modulation symbol of a multilevel modulation system; a demodulation step in which transmitted signals are judged based on reception signal points from when the modulation symbol was received, and an appearance probability of the received signal points; and a step in which decoding of error correction codes from judgment results from the demodulating device is performed, and feasibilities of reception signals obtained in this decoding process are fed back as appearance probabilities for the reception signals, wherein in the bit mapping process, the information bits are placed in bit positions of the modulation symbol where it is difficult for an error to occur.

In the data transmission method according to the present invention, in the bit mapping process, groups made up of the information bits and the parity bits that are each created by a different element coder are placed in the same modulation symbol.

In the data transmission method according to the present invention, in the bit mapping process, exactly the same number of the parity bits that have each been created by a different element coder are placed respectively in the same modulation symbol.

In the data transmission method according to the present invention, in the bit mapping process, of the parity bits that have each been created by a different element coder, those parity bits that are used first in the coding process are placed in bit positions of the modulation symbol where it is difficult for an error to occur in advance of parity bits that are used later in the coding process.

In order to solve the above described problems, the data transmission system according to the present invention includes: a bit mapping means that maps coded bits, which are made up of information bits and parity bits that are each created by a different element coder from the information bits, onto a modulation symbol of a multilevel modulation system; a demodulating device that, in signal spaces that are formed by sub-carriers within a range over which a single modulation symbol is diffused, judges transmitted signals based on reception signal points that take reception values of each sub-carrier as coordinates, on reference constellations points that are combinations of coordinates originally taken for the reception signal points, and on an appearance probability of the received signal points; and a device that performs decoding of error correction codes from judgment results from the demodulating device, and feeds feasibilities of reception signals obtained in this decoding process back as appearance probabilities for the reception signals, wherein the bit mapping means places the information bits in bit positions of the modulation symbol where it is difficult for an error to occur.

In the data transmission system according to the present invention, the bit mapping means places the parity bits that have each been created by a different element coder on the modulation symbol such that groups that are made up of the information bits and the parity bits that are each created by a different element coder are placed on the same reference signal point.

In the data transmission method according to the present invention, the bit mapping means places exactly the same number of the parity bits that have each been created by a different element coder respectively on the same reference signal point.

In the data transmission method according to the present invention, of the parity bits that have each been created by a different element coder, the bit mapping means places those parity bits that are used first in the coding process in bit positions of the modulation symbol where it is difficult for an error to occur in advance of parity bits that are used later in the coding process.

The data transmission method according to the present invention includes: a bit mapping step in which coded bits, which are made up of information bits and parity bits that are each created by a different element coder from the information bits, are mapped onto a modulation symbol of a multilevel modulation system; a demodulation step in which, in signal spaces that are formed by sub-carriers within a range over which a single modulation symbol is diffused, transmitted signals are judged based on reception signal points that take reception values of each sub-carrier as coordinates, on reference constellations points that are combinations of coordinates originally taken for the reception signal points, and on an appearance probability of the received signal points; and a step in which error correction codes are decoded from judgment results from the demodulation step, and feasibilities of reception signals obtained in this decoding step are fed back as appearance probabilities for the reception signals, wherein in the bit mapping step, the information bits are placed in bit positions of the modulation symbol where it is difficult for an error to occur.

In the data transmission method according to the present invention, in the bit mapping step, the parity bits that have each been created by a different element coder are placed on the modulation symbol such that groups that are made up of the information bits and the parity bits that are each created by a different element coder are placed on the same reference signal point.

In the data transmission method according to the present invention, in the bit mapping step, exactly the same number of the parity bits that have each been created by a different element coder are placed respectively on the same reference signal point.

In the data transmission method according to the present invention, in the bit mapping step, of the parity bits that have each been created by a different element coder, those parity bits that are used first in the coding process are placed in bit positions of the modulation symbol where it is difficult for an error to occur in advance of parity bits that are used later in the coding process.

Effects of the Invention

According to the present invention, it is possible to increase a bit error rate reduction effect and contribute to the achievement of more reliable communication.

According to the present invention, in a data transmission system which uses systematic code such as turbo code, it is possible to achieve bit mapping onto a multilevel modulation symbol that is suitable for cases in which demodulation having a feedback loop for stochastic coupling such as twin turbo decoding is applied.

According to the present invention, in a code division multiple transmission system which uses systematic code such as turbo code, it is possible to achieve bit mapping onto a multilevel modulation symbol that is suitable for cases in which maximum likelihood is estimated from reception signals without back-diffusion being performed, and for cases in which demodulation having a feedback loop for stochastic coupling such as twin turbo decoding is performed.

BRIEF DESCRIPTION OF THE DRAWINGS

FIG. 2 is a view showing an example of a check matrix H of a low density parity check code.

DESCRIPTION OF THE REFERENCE NUMERALS

Figure 1:
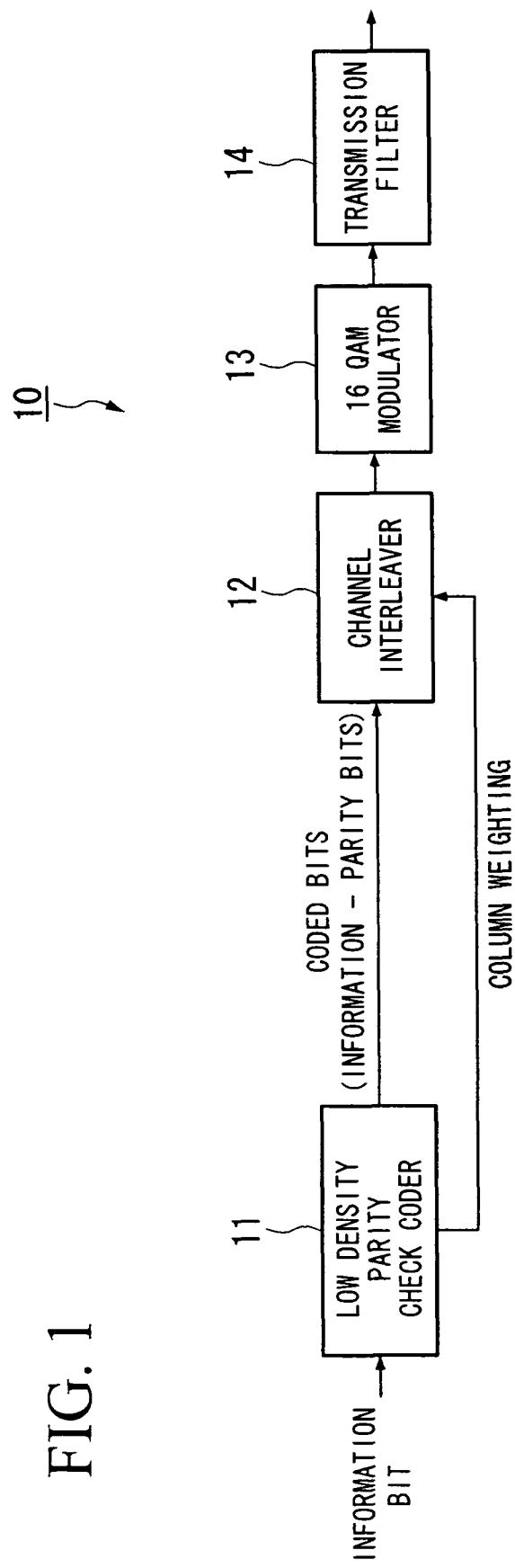
FIG. 1 is a block diagram showing the structure of a transmitter 10 according to a first embodiment of the present invention.

10 Transmitter
11 Low density parity check coder
12 Channel interleaver
13 16 QAM modulator
13, 14 Transmission filter 21, 22 Bit reorder
23 Time multiplexer
41 Block interleaver
100 Transmitter
101 Turbo coder
102 Puncturing
103 Bit interleaver
104 Modulator
111 Element coder
112, 212 Turbo interleaver
200 Receiver
201 Twin turbo decoder
210 Demodulator
211 Element decoder
213 Turbo deinterleaver
1000 Transmitter
1010 Turbo coder
1020 Puncturing
1030 Bit interleaver
1040 Modulator
1060 Diffuser
2000 Receiver

BEST MODE FOR CARRYING OUT THE INVENTION

Respective embodiments of the present invention will now be described with reference made to the drawings.

First Embodiment

A first embodiment of the present invention will now be described.

FIG. 1 is a block diagram showing the structure of a transmitter 10 according to the first embodiment of the present invention. In FIG. 1, the transmitter 10 is provided with a low density parity check coder 11, a channel interleaver 12, a 16 QAM modulator 13, and a transmission filter 14.

The low density parity check coder 11 encodes input information bits into low density parity check codes, and outputs coded bits (i.e., information bits and parity bits) and column weightings. The column weighting represents the degree of importance of the coded bit. The coded bits and the column weightings are input into the channel interleaver 12.

Based on the column weightings, the channel interleaver 12 alters the time series order of the coded bits. It then outputs the coded bits in the altered time series order.

The 16 QAM modulator 13 maps the coded bits in time series order that have been output from the channel interleaver 12 on a 16 QAM modulation symbol (i.e., a 16 QAM symbol). This 16 QAM symbol is then transmitted via the transmission filter 14.

Here, the characteristic bit mapping process (i.e., the process to map the coded bits on a multilevel modulation symbol) of the present embodiment will be described.

The coded bits (i.e., the information bits and parity bits) and the column weightings shown in FIG. 2 are input from the low density parity check coder 11 into the channel interleaver 12. In FIG. 2, an example of a check matrix H for a low density parity check code is shown. The check matrix H shown in FIG. 2 is the binary low density parity check code designed as a finite field having an order of 2 that is disclosed in Non-patent document 3, and shows a case in which the number of information bits thereof is 10 and the code rate is ½, and is a case in which the first string through the tenth string are parity bits, while the eleventh string through twentieth string are information bits.

In FIG. 2, the column weighting is recorded so as to correspond to each string. In the check matrix H in FIG. 2, the column weighting of each parity bit string from the first string through the sixth string is 2, the column weighting of each parity bit string from the seventh string through the tenth string is 3, the column weighting of each information bit string from the eleventh string through the twelfth string is 3, the column weighting of each information bit string from the thirteenth string through the seventeenth string is 4, and the column weighting of each information bit string from the eighteenth string through the twentieth string is 5. In addition, in the check matrix H shown in FIG. 2, while the column weighting of a sub-matrix relating to the parity bits of the first through tenth strings is from 2 to 3, the column weighting of a sub-matrix relating to the information bits of the eleventh through twentieth strings is from 3 to 5, namely, the column weighting of the information bits is larger than that of the parity bits. Namely, the column weighting of any of the information bits is larger than the column weighting of the parity bits.

Note that in the example in FIG. 2, the number of elements in each string having a bit value of '1' is used as the column weighting, however, the column weighting is not limited to this and it is sufficient if the information shows the degree of importance of the coded bits of each string of the check matrix H that is made up of coded bits (i.e., the information bits and parity bits) out port from the low density parity check coder 11.

Figure 3:
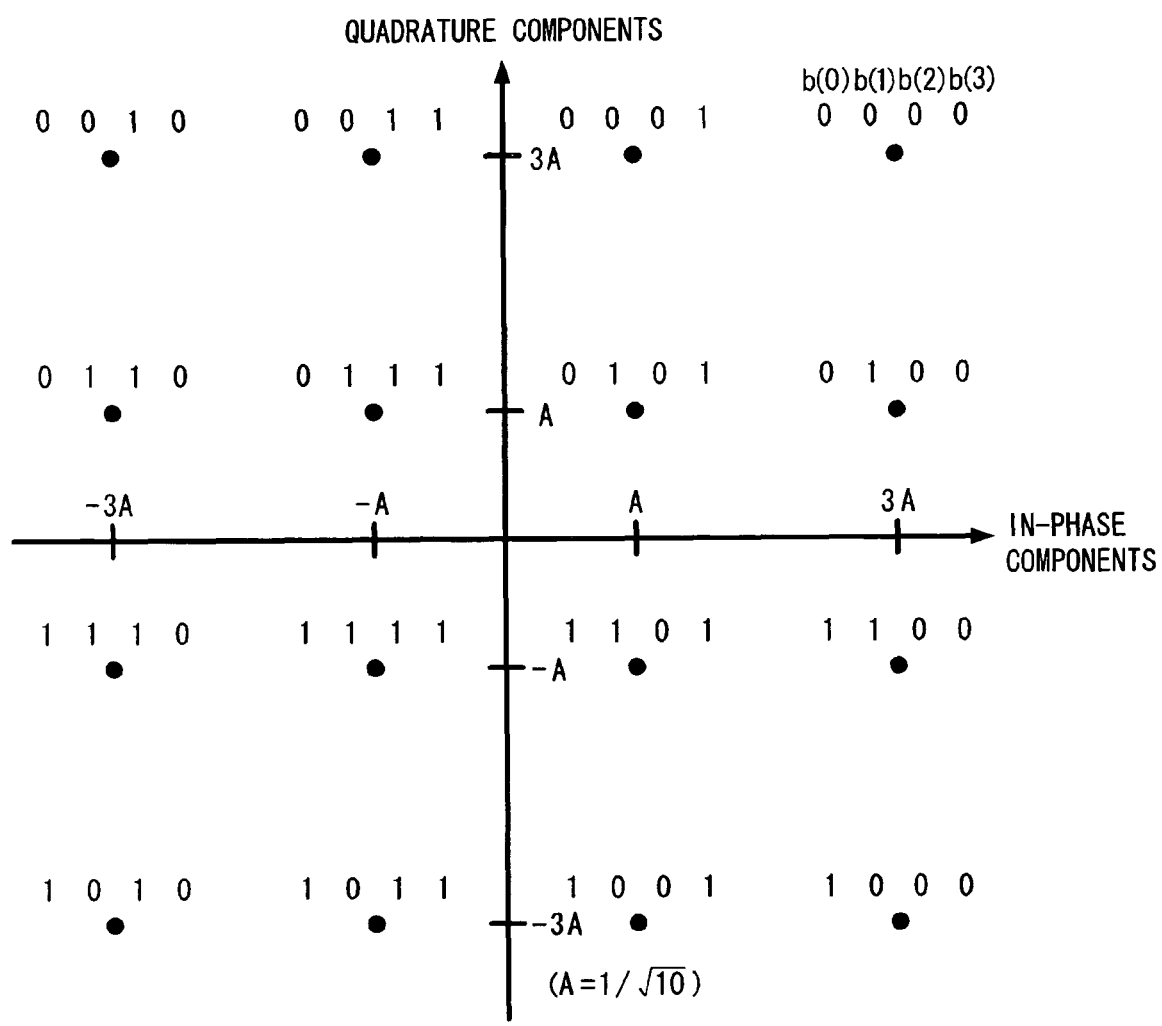
FIG. 3 is a view showing the constellation diagram of a 16 QAM symbol.

A constellation diagram of 16 signal points of a 16 QAM symbol is shown in FIG. 3. The 16 QAM symbol is made up of four bits [b (0) b (1) b (2) and b (3)]. As is shown in FIG. 3, b (0) and b (1) have decision points in quadrature components, while b (2) and b (3) have decision points in the in-phase components. Here, a relationship between the signal point and bit error rates of a 16 QAM symbol will be considered.

A soft decision value $L_c(n_c)$ of the $n_c$-th reception bit are shown by Formula (10).

[Formula 10]

$$L_c(n_c) = \gamma(n_c) \left\{ \min_{M \in M_1(n_c, n_m)} |M_r(n_m) - M|^2 - \min_{M \in M_0(n_c, n_m)} |M_r(n_m) - M|^2 \right\} \quad (10)$$

Wherein $M_r(n_m)$ is a reception modulation symbol, and $\gamma(n_c)$ is a signal-to-noise power ratio. Moreover, $M_1(n_c, n_m)$ represents a constellation diagram that satisfies [b $(n_c-R_{bit}n_m)$=0], and $M_0(n_c, n_m)$ represents a constellation diagram that satisfies [b $(n_c-R_{bit}n_m)$=1]. Moreover, Rb is the transmission efficiency and, in the case of 16 QAM modulation, [$R_{bit}$=4]

Here, in order to simplify the explanation, if the absolute value of the difference between the least squares distances in Formula (10) is taken as d $(n_c)$, then d $(n_c)$ is expressed by Formula (11).

[Formula 11]

$$d(n_c) = \left| \min_{M \in M_1(n_c, n_m)} |M_r(n_m) - M|^2 - \min_{M \in M_0(n_c, n_m)} |M_r(n_m) - M|^2 \right| \quad (11)$$

Figure 4:
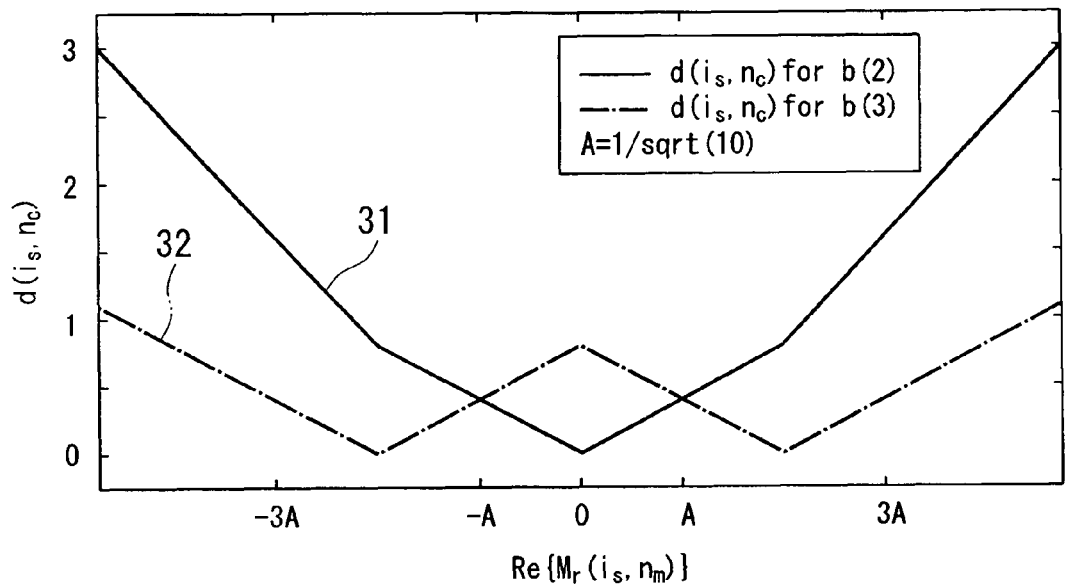
FIG. 4 is a graph showing a relationship between reception signal points of a 16 QAM symbol and d ($n_c$).

FIG. 4 is graph showing a relationship between reception signal points of a 16 QAM symbol and d $(n_c)$. In FIG. 4, d $(n_c)$ at the time when the reception signal point is changed is plotted on a graph for b (2) and b (3) which have decision points in in-phase components. A waveform 31 is the graph line for b (2), while a waveform 32 is the graph line for b (3). As is clear from FIG. 4, compared with b (3), the reception signal point range where a higher d ($n_c$) can be obtained is larger for b (2). This fact shows that b (2) provides a larger soft decision value than b (3). As a result, it was considered that b (2) had better noise resistance than b (3), namely, there is less likelihood that errors will be generated in the bit position of b (2) than in that of b(3). When the same considerations were made for b (0) and b (1) which have decision points in quadrature components, then it was found that there was less likelihood of bit errors being generated in the bit position of b (0) than in that of b(1).

As a result of the above considerations, in the signal points for a 16 QAM symbol, there is less likelihood of errors being generated in the bit positions of b (0) and b (2) than in those of b(1) and b (3). Based on this finding, in the bit mapping process of the present embodiment, a structure is employed in which coded bits having a higher degree of importance are mapped at b (0) and b (1) which are bit positions where it is difficult for errors to occur. Because of this, in the transmitter 10, b (0) and b (2) of a 16 QAM symbol are set in advance in bit positions where it is difficult for errors to occur.

A description will now be given of a structure that achieves the characteristic bit mapping process of the present embodiment.

Figure 5:
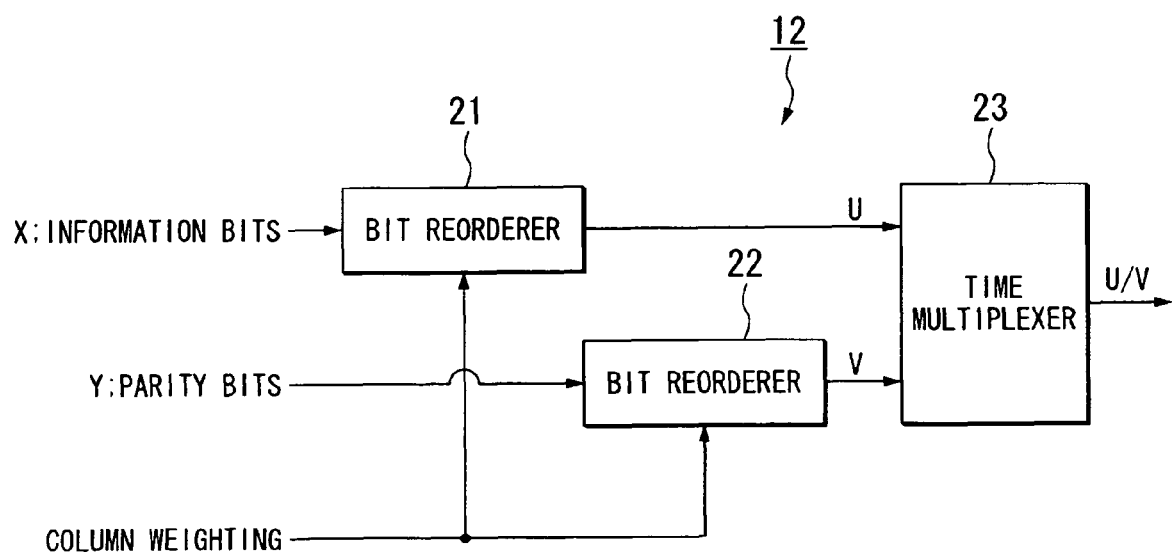
FIG. 5 is a block diagram showing the structure of a channel interleaver 12 shown in FIG. 1.

FIG. 5 is a block diagram showing the structure of the channel interleaver 12 shown in FIG. 1. In FIG. 5, the channel interleaver 12 has bit reorderers 21 and 22, and a time multiplexer 23.

An information bit vector X is input into the bit reorderer 21, and a parity bit vector Y is input into the bit reorderer 22. The series length is N for both the information bit vector X and the parity bit vector Y Moreover, column weightings are also input into the bit reorderers 21 and 22. These column weightings express the degree of importance of each bit of the information bit vector X and parity bit vector Y.

The bit reorderer 21 rearranges in descending order (i.e., starting from the highest degree of importance) the column weightings of each bit from the information bit vector X. An information bit vector U that is created after this rearrangement is input into the time multiplexer 23. The bit reorderer 22 rearranges in descending order (i.e., starting from the highest degree of importance) the column weightings of each bit from the parity bit vector Y. A parity bit vector V that is created after this rearrangement is input into the time multiplexer 23. The information bit vector U and the parity bit vector V are expressed by Formula (12).

[Formula 12]
$$\begin{cases} U = [u(0)u(1) \ldots u(N-1)] \\ V = [v(0)v(1) \ldots v(N-1)] \end{cases} \quad (12)$$

Here, in the present embodiment, because the low density parity check code illustrated in the above described FIG. 2 is used, the column weighting of the information bit vector U is greater than the column weighting of the parity bit vector V.

The time multiplexer 23 performs time multiplexing on the information bit vector U and the parity bit vector V. In this time multiplexing processing, coded bits that have a higher degree of importance are mapped in the subsequent 16 QAM modulator 13 at b (0) and b (2) which are bit positions on the 16 QAM symbol where it is more difficult for an error to occur. Namely, in the present embodiment, information bits are mapped at b (0) and b (2) which are bit positions where it is more difficult for an error to occur.

The 16 QAM modulator 13 of the present embodiment maps one bit of the input bit string at each of b (0), b (1), b (2), and b (3), however, at this time, in the input sequence of the bits, it performs sequential mapping in the sequence b (0), b (1), b (2), b (3), b (0), b (1) . . . . The time multiplexer 23 then repeatedly links each bit of the information bit vector U and the parity bit vector V in the sequence of "information bit then parity bit", and creates a bit string to be input into the 16 QAM modulator 13.

Figure 6:
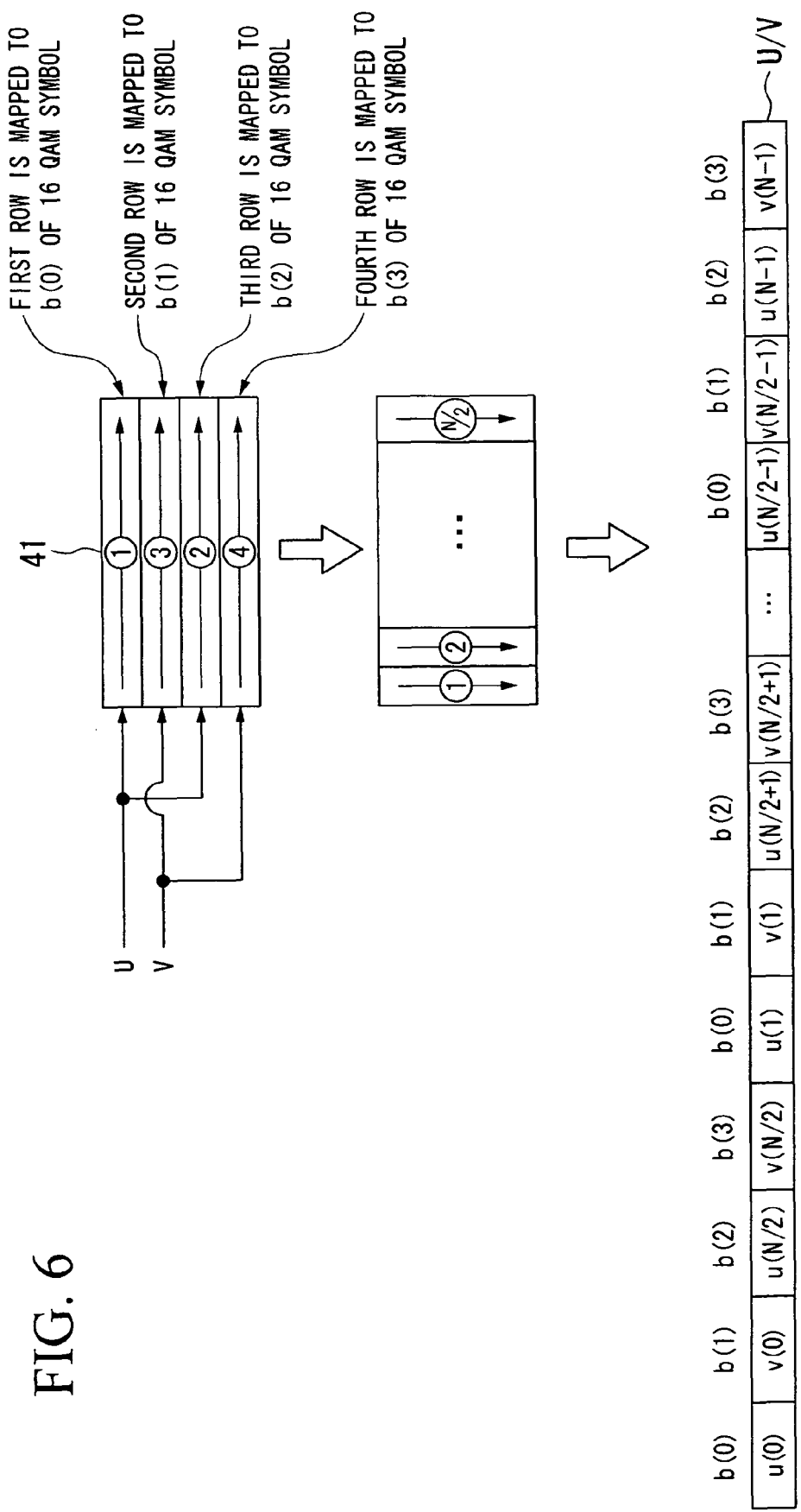
FIG. 6 is an explanatory view showing an example of time multiplexing processing performed by a time multiplexer 23.

An example of time multiplexing processing performed by the time multiplexer 23 is shown in FIG. 6. In the example in FIG. 6, a block interleaver 41 is used. The block interleaver 41 has a bit storage area composed of four rows and N/2 strings. As is shown in FIG. 6, in the bit storage area of the block interleaver 41, the first row is the area for storing the data to be mapped at b (0) on the 16 QAM symbol, the second row is the area for storing the data to be mapped at b (1) on the 16 QAM symbol, the third row is the area for storing the data to be mapped at b (2) on the 16 QAM symbol, and the fourth row is the area for storing the data to be mapped at b (3) on the 16 QAM symbol.

In FIG. 6, for the information bit vector U having a series length N, N/2 bits from u (0) to u (N/2−1) are written to the first row of the bit storage area of the block interleaver 41, and N/2 bits from u (N/2) to u (N−1) are written to the third row thereof. For the parity bit vector V having a series length N, N/2 bits from v (0) to v (N/2−1) are written to the second row of the bit storage area of the block interleaver 41, and N/2 bits from v (N/2) to v (N−1) are written to the fourth row thereof.

Next, bits are read in the string direction from the bit storage area where the information bit vector U and the parity bit vector V are written. The sequence in which they are read is from the bit in the first row in each string sequentially from the first string to the N/2 string. As a result, an output bit string U/V is obtained.

This output bit string UN is output to the 16 QAM modulator 13. In addition, as is shown in FIG. 6, in the 16 QAM modulator 13, u (0) to u (N/2−1) are mapped to b (0) of the 16 QAM symbol, v (0) to v (N/2−1) are mapped to b (1) of the 16 QAM symbol, u (N/2) to u (N−1) are mapped to b (2) of the 16 QAM symbol, and v (N/2) to v (N−1) are mapped to b (3) of the 16 QAM symbol. As a result, of the coded bits, the information bits having the highest degree of importance are mapped to b (0) and b (2) which are bit positions of the 16 QAM symbol where it is more difficult for an error to occur.

Note that if the information for bit mapping on the 16 QAM symbol in the transmitter 10 is shared with the receiving side, then it is possible for the modulation to be on the receiving side.

Figures 7, 8:
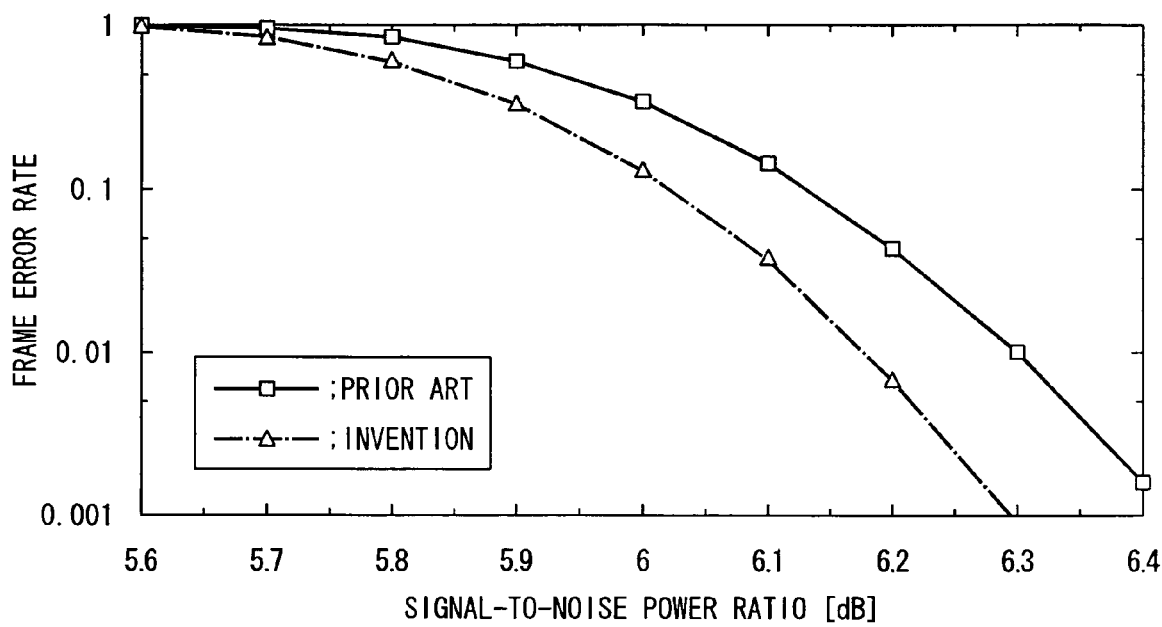
FIG. 7 is a graph showing simulation results in order to show the effects obtained from the bit mapping processing according to the first embodiment of the present invention.
FIG. 8 is a table showing simulation parameters according to FIG. 7.

FIG. 7 is a graph showing simulation results in order to show the effect of the bit mapping process of the present embodiment. In FIG. 7 the results are shown for the simulation of the frame error rate when the signal-to-noise power ratio is changed. The simulation parameters for this are shown in FIG. 8. In a conventional bit mapping process, the information bits are mapped with equal probability at the bit positions b (0) and b (2) where it is difficult for an error to occur, and at the bit positions b (1) and b (3) where it is easy for an error to occur.

As is clear from FIG. 7, according to the bit mapping process of the present embodiment, compared to the conventional technology, it is possible to reduce the signal-to-noise power ratio that is required in order to achieve the same frame error rate. For example, the signal-to-noise power ratio that is required in order to achieve a frame error rate of 1% can be reduced by 0.12 dB compared to the conventional technology. Because of this, it becomes possible to efficiently achieve communication that is highly reliable and has a low error rate.

As is described above, according to the present embodiment, it is possible to increase the bit error rate reduction effect and, for example, reduce the signal-to-noise power ratio that is required in order to achieve a required frame error rate. It is thus possible to efficiently achieve communication that is highly reliable and has a low error rate.

Moreover, according to the present embodiment, the effects shown below are obtained.

(1) As in the case of the low density parity check codes described in Non-patent document 3, in a case in which a multilevel modulation system that transmits two or more bits to each component (i.e., in-phase components or quadrature components) of a modulation symbol, such as 16 QAM modulation, is used for code words in which the degree of importance of the coded bits varies such as when the column weighting of any of the weighting bits is greater than the column weighting of the parity bits, it becomes possible to provide a more suitable bit mapping method, and the bit error rate can be substantially reduced. As a result, it becomes possible to achieve highly reliable communication.

A first embodiment of the present invention has been described in detail above with reference made to the drawings, however, the specific structure of the present invention is not limited to this embodiment, and various design alterations may also be made insofar as they do not depart from the spirit or scope of the present invention.

For example, in the above described first embodiment, column weightings are input into the channel interleaver 12 and the time series order of the coded bits is altered, however, it is also possible to employ a structure in which the column weightings are input into the 16 QAM modulator 13 and, based on these column weightings, the 16 QAM modulator 13 performs both the time series ordering of the coded bits and the mapping on a 16 QAM symbol.

Moreover, as a result of the low density parity check coder 11 outputting coded bits in descending order or ascending order of the column weighting, it is also possible to provide the degree of importance information that expresses the degree of importance of a coded bit in the actual coded bit itself. In this case, output of the column weighting may be omitted.

Moreover, in the above described first embodiment, the column weightings of the check matrix H of the low density parity check codes are used as degree of importance information that shows the degree of importance of the coded bits, however, the degree of importance information is not limited to this and various type of indexes may be used.

Moreover, in the above described first embodiment, a description is given using low density parity check codes as an example, however, provided that degree of importance information can be obtained that shows the degree of importance of a coded bit, then the present invention can be applied to codes other than low density parity check codes.

Moreover, in the above described first embodiment, a description is given using 16 QAM as an example of a multilevel modulation system that can be used in the present invention, however, the present invention is not limited to this and, for example, ASK (Amplitude Key Shifting), 64 QAM, 256 QAM and the like can also be used in the present invention. Moreover, provided that the multilevel modulation system is one that transmits two or more bits of the in-phase components or quadrature components of a modulation symbol, then the effects from the present invention can be satisfactorily obtained.

Figure 9:
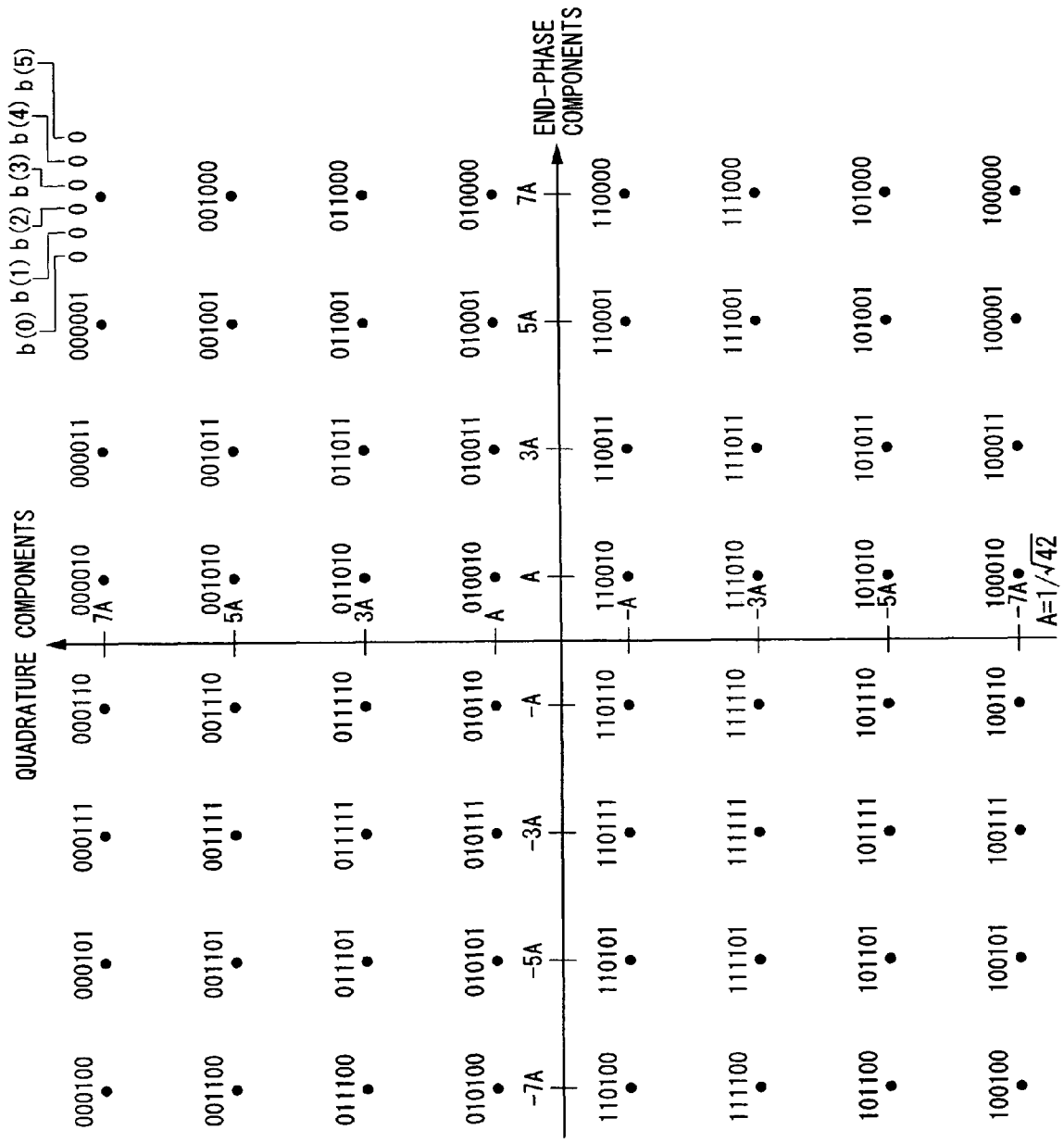
FIG. 9 is a view showing the constellation diagram of a 64 QAM symbol.

FIG. 9 shows a constellation diagram of a 64 QAM modulation symbol (i.e., a 64 QAM symbol). In FIG. 9, the placement of 64 signal points of a 64 QAM symbol is shown. The 64 QAM symbol is formed by 6 bits [b (0) b (1) b (2) b (3) b (4) b (5)]. The MSB (Most Significant Bit) is b (0), followed in order by b (1), b (2), b (3), b (4), and the LSB (Least Significant Bit) is b (5).

In the constellation diagram of the 64 QAM symbol shown in FIG. 9, the bits (b (0) and b (3) are the bit positions where it is most difficult for an error to occur, while the bits (b (2) and b (5) are the bit positions where it is the easiest for an error to occur. The bits b (1) and b (4) are bit positions that have an intermediate possibility of an error occurring (i.e., there is a greater likelihood of an error occurring than in b (0) and b (3) and a lesser likelihood of an error occurring than in b (2) and b (5)).

In 256 QAM, the modulation symbol thereof (i.e., a 256 QAM symbol) is formed by 8 bits [b (0) b (1) b (2) b (3) b (4) b (5) b (6) b (7)]. The MSB (Most Significant Bit) is b (0), followed in order by b (1), b (2), b (3), b (4), b (5), b (6) and the LSB (Least Significant Bit) is b (7).

In the constellation diagram of a 256 QAM symbol, the bits (b (0) and b (4) are bit positions where it is most difficult for an error to occur. Next, the bits (b (1) and b (5) are bit positions where it is somewhat difficult for an error to occur. Next, the bits (b (2) and b (6) are bit positions where it is somewhat easier for an error to occur, and the bits (b (3) and b (7) are bit positions where it is easy for an error to occur.

Moreover, the present invention can be applied to either wired or wireless data transmission.

Second Embodiment

A second embodiment of the present invention will now be described.

Figure 10:
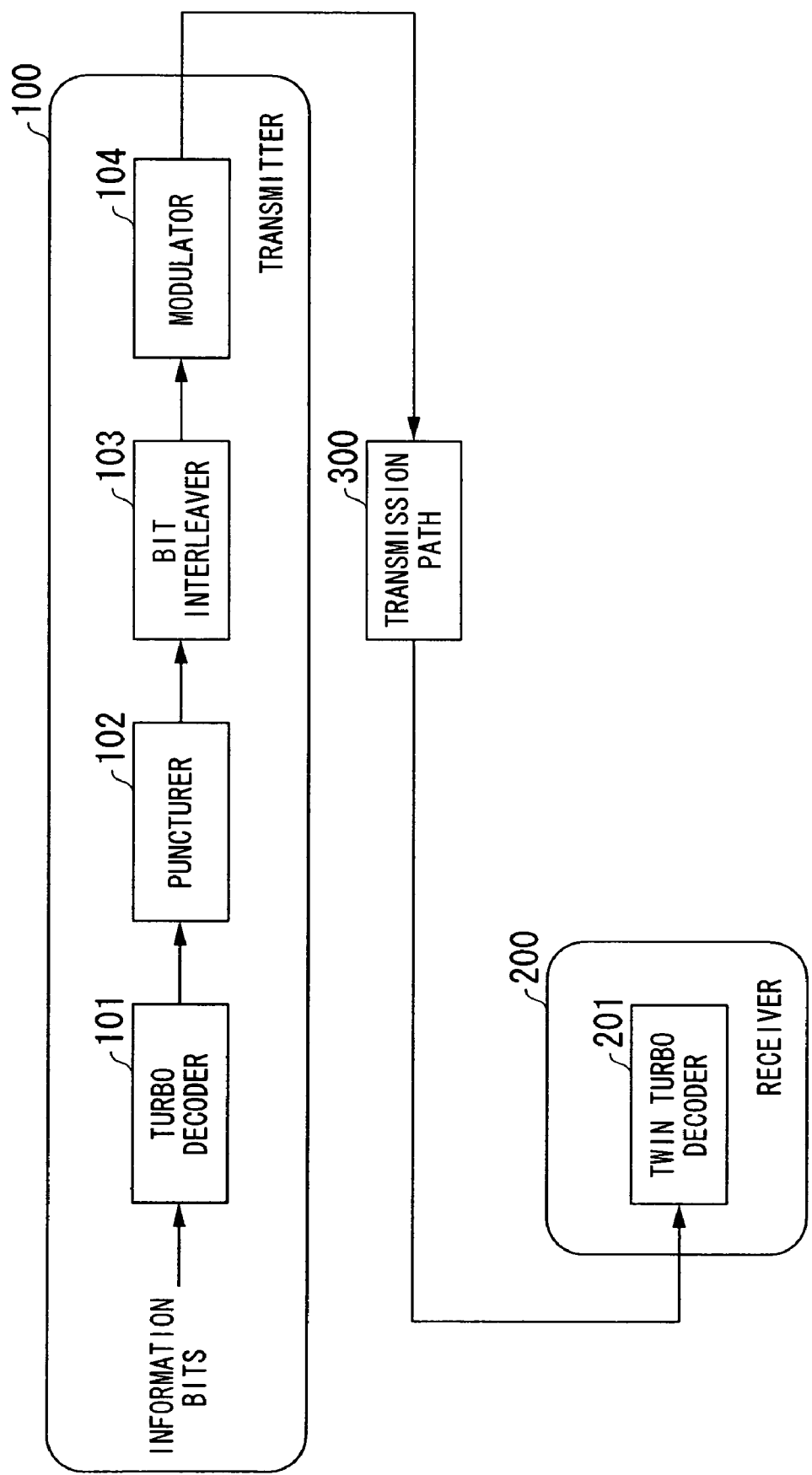
FIG. 10 is a block diagram showing the structure of a data transmission system according to a second embodiment of the present invention.
Figure 11:
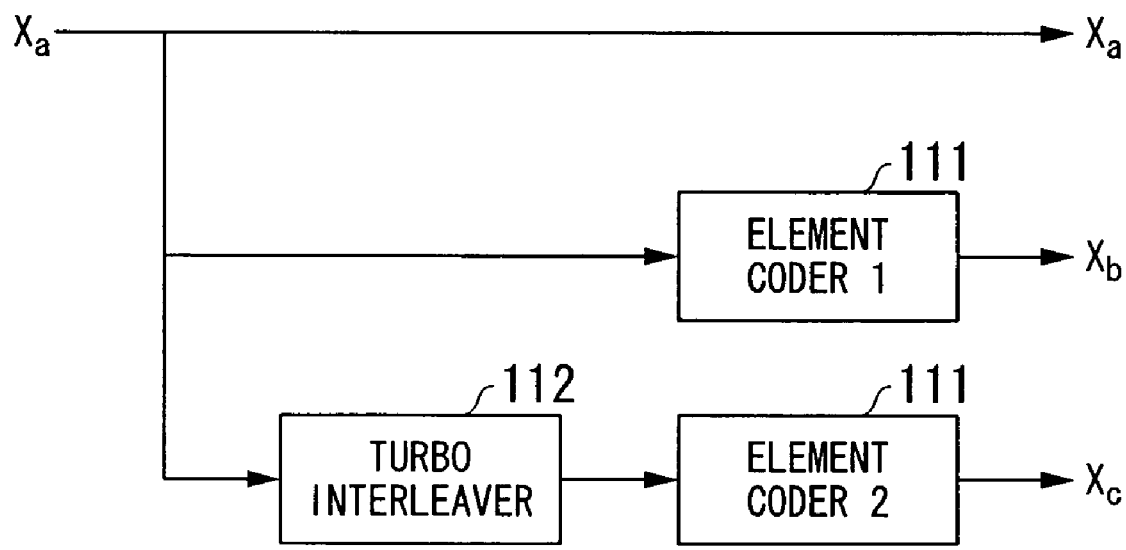
FIG. 11 is a block diagram showing the structure of a turbo coder.

FIG. 10 is a block diagram showing the structure of a data transmission system according to a second embodiment of the present invention. FIG. 11 is a block diagram showing the structure of a turbo coder 101.

Figure 29:
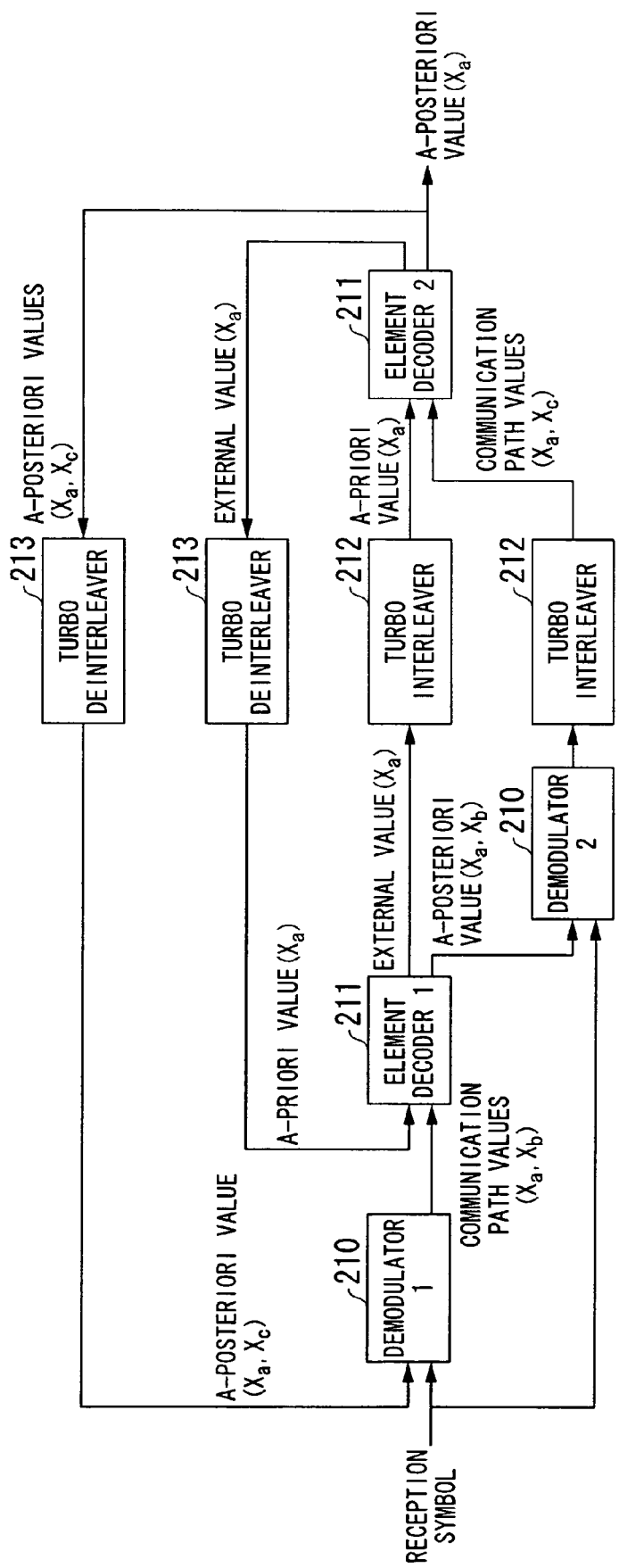
FIG. 29 is a block diagram showing the structure of a twin turbo decoder in the conventional technology.
Figure 30:
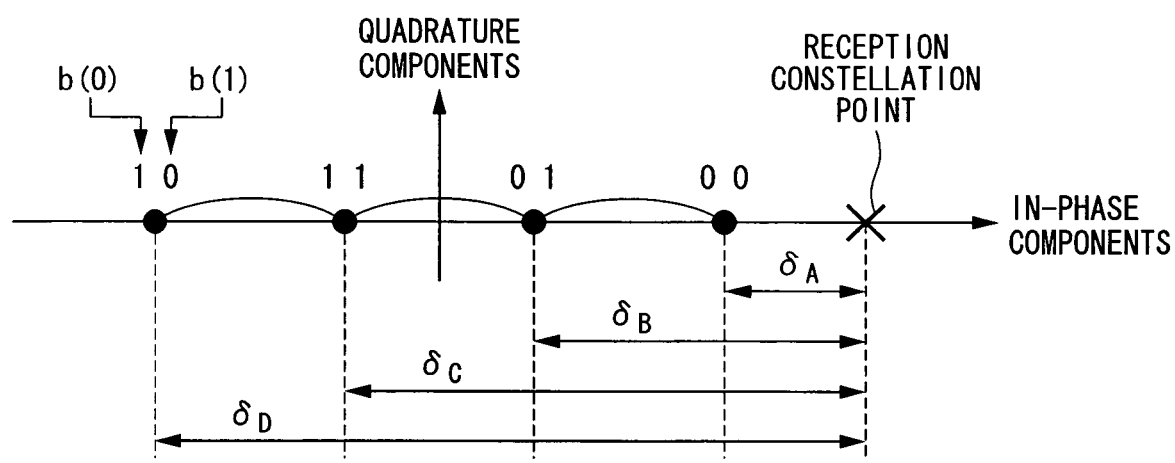
FIG. 30 is a view showing the constellation diagram of a 4ASK symbol in the conventional technology.

In FIG. 10, the turbo coder 101 turbo codes an information bit vector $X_a$, and a parity bit vector $X_b$ is created by an element coder 1_111 shown in FIG. 11 while a parity bit vector $X_c$ is created by an element coder 2_111. Next, a puncturer 102 creates a code sequence having an optional code rate by puncturing the parity bit vectors $X_b$ and $X_c$. Next, a bit interleaver 103 performs bit interleaving. Next, a modulator 104 modulates the coded bits which have undergone bit interleaving by mapping them to a modulation symbol in accordance with the bit mapping rules according to the present embodiment. After modulation, the signals are transmitted. The transmitted signals are changed by a transmission path 300 and are received by a receiver 200. In the receiver 200, the received signals are modulated by a twin turbo decoder 201. The structure of the twin turbo decoder 201 is shown in FIG. 29.

In the bit mapping method according to the present embodiment, coded bits are mapped in accordance with the following Rules 1, 2, and 3 (i.e., order of priority).

(Rule 1) Information bits are placed in bit positions where it is difficult for an error to occur.

(Rule 2) The same number of parity bits that are created by the element coder 1_111 as the number of parity bits that are created by the element coder 2_111 are placed in the same modulation symbol.

(Rule 3) Parity bits that are created by the element coder 1_111 are placed in bit positions where it is more difficult for an error to occur than the bit positions where parity bits created by the element coder 2_111 are placed.

Here, the reasons why the above described rules 1, 2, and 3 are employed are described.

[The Reason of Rule 1]

In the twin turbo decoder 201, while the parity bit communication path value is used in just one of the element decoders 211, the information bit communication path value is used in both of the element decoders 1_111 and 2_111. Accordingly, information bits can be said to have a greater degree of importance than parity bits. Because of this, the signal-to-noise power ratio of the information bits can be improved by the above described Rule 1.

[The Reason of Rule 2]

In the twin turbo decoder 201, the a-posteriori values of parity bits that are input into a demodulator 1_210 are only those created by the element decoder 2_211, and those created by the element decoder 1_211 are not input. In contrast, the a-posteriori values of the parity bits that are input into a demodulator 2_210 are only those created by the element decoder 1_211, and those created by the element decoder 2_211 are not input. Accordingly, if the parity bits created by any one of the element decoders 111 are consolidated in a single modulation symbol, then bits are generated in which the a-posteriori values of pair bits cannot be obtained in either one of the demodulators 1_210 and 2_210, and the communication path values of these bits are not updated. As a result of this, because the number of pair bits that it is possible to use in communication path value update processing is equal in both of the demodulators 1_210 and 2_210 due to the above described Rule 2, the accuracy of the updating of the communication path values in both demodulators 1_210 and 2_210 is uniformized.

[The Reason of Rule 3]

In the twin turbo decoder 201, the number of updates of the communication path value of the demodulator 2_210 is one more than the number of updates for the demodulator 1_210. Accordingly, by improving the signal-to-noise power ratio of the communication path value of the parity bits input into the demodulator 2_210, the accuracy of the updating of the communication path value is improved. As a result of this, due to Rule 3, it is possible to improve the signal-to-noise power ratio of the parity bits created by the element coder 1_211.

A description will now be given of the bit mapping method of the present embodiment using specific examples. Note that, here, the constellation diagram of the 16 QAM symbol shown in FIG. 3 and the constellation diagram of the 64 QAM symbol shown in FIG. 9 are used as examples.

In the constellation diagram of the 16 QAM symbol shown in FIG. 3, the bits b (0) and b (2) are in bit positions where it is difficult for an error to occur, while the bits b (1) and b (3) are in bit positions where it is easy for an error to occur.

In the constellation diagram of the 64 QAM symbol shown in FIG. 9, the bits b (0) and b (3) are in bit positions where it is difficult for an error to occur, while the bits b (2) and b (5) are in bit positions where it is easy for an error to occur. There is an intermediate likelihood of an error occurring in the bit positions b (1) and b (4) (i.e., these bit positions have a greater likelihood of an error occurring than the positions of the bits b (0) and b (3) and a lesser likelihood than the positions of the bits b (2) and b (5).

Moreover, the information bits in the i-th position after the bit interleaving are taken as $X_a'(i)$, the parity bits at the j-th position that are created by the element coder 1_111 after the bit interleaving are taken as $X_b'(j)$, and the parity bits at the j-th position that are created by the element coder 2_111 after the bit interleaving are taken as $X_c'(j)$.

Firstly, specific examples (i.e., case A1, case A2, and case A3) of when the 16 QAM symbol shown in FIG. 3 is used will be described.

[Case A1: the modulation is 16 QAM modulation, and the code rate is ⅓ (i.e., the number of information bits is less than the number of parity bits)].

Figure 12:
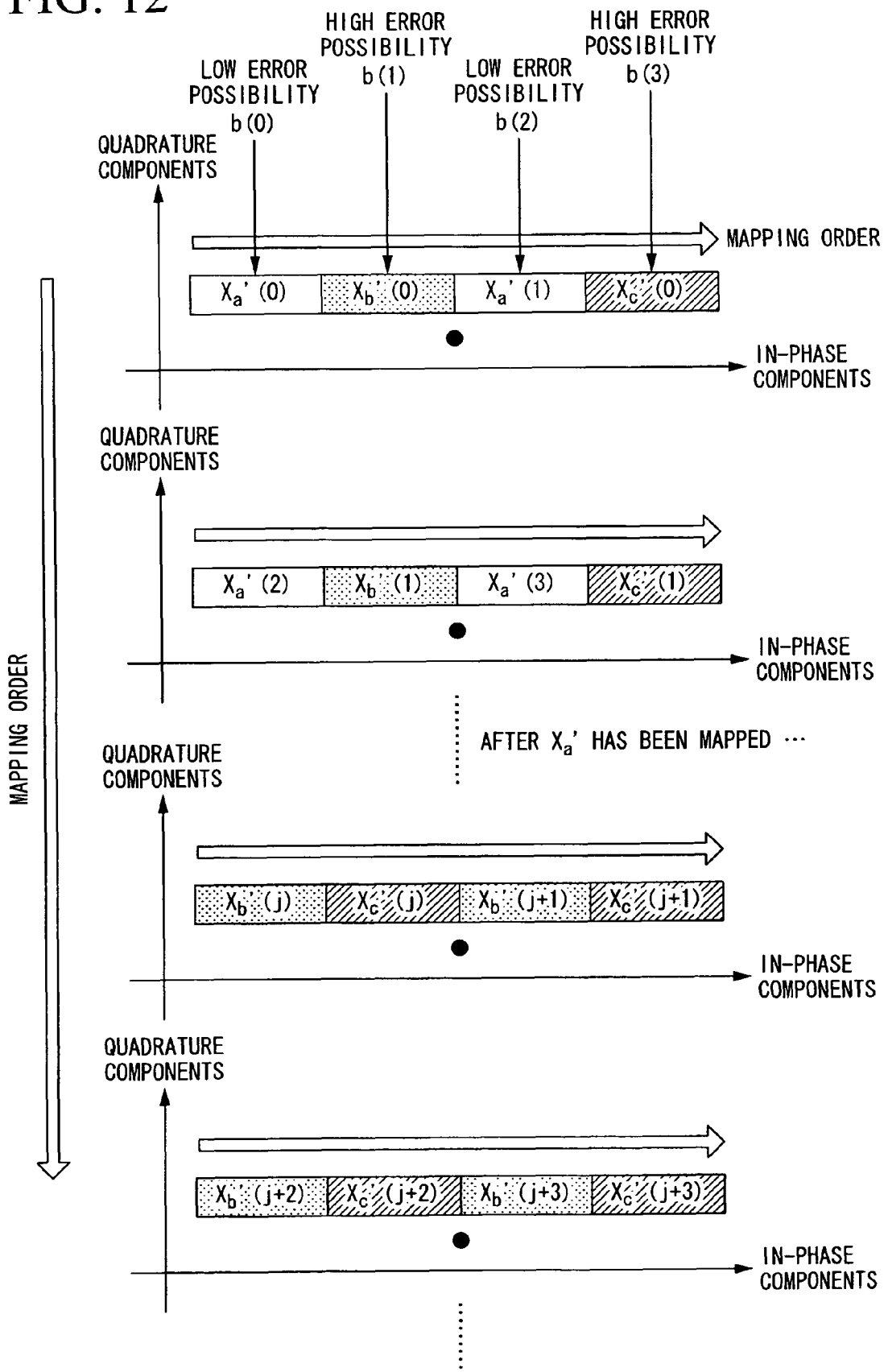
FIG. 12 is a conceptual view showing a bit mapping procedure according to the second embodiment of the present invention.

FIG. 12 is a conceptual view showing a bit mapping procedure according to the present embodiment when the modulation is 16 QAM and the code rate is ⅓. In this case, firstly, the information bits $X_a'(i)$ are placed in bit positions where it is difficult for an error to occur. In addition, the parity bits $X_b'(j)$ are placed at one of the bit positions where it is easy for an error to occur, and the parity bits $X_c'(j)$ are placed at the other of the bit positions where it is easy for an error to occur. After all the information bits have been positioned, the remaining parity bit $X_b'(j)$ is placed in a bit position where it is difficult for an error to occur, and the parity bit $X_c'(j)$ is placed in a bit position where it is easy for an error to occur.

[Case A2: the modulation is 16 QAM modulation, and the code rate is ½ (i.e., the number of information bits is the same as the number of parity bits)].

Figure 13:
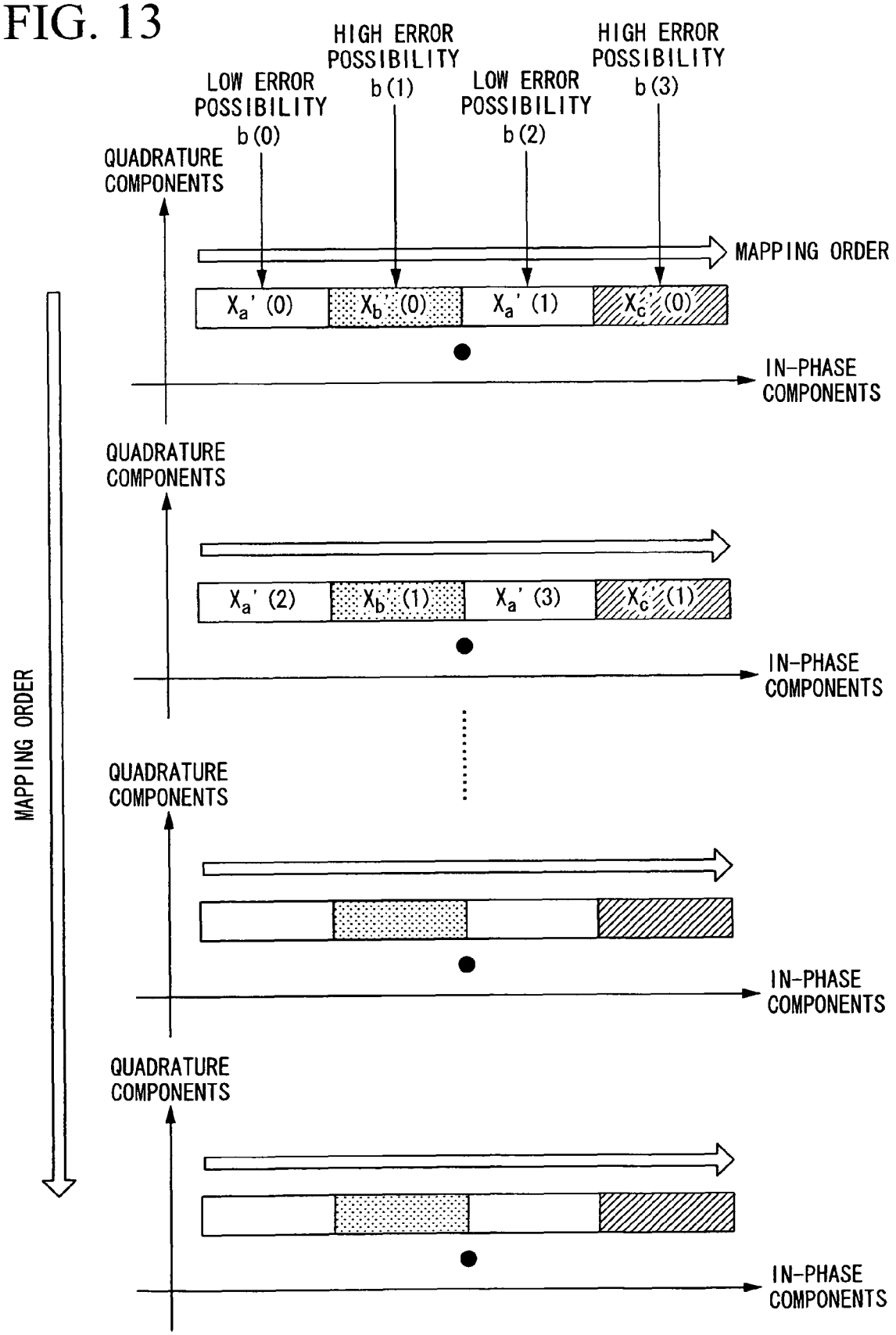
FIG. 13 is a conceptual view showing the bit mapping procedure according to the second embodiment of the present invention.

FIG. 13 is a conceptual view showing a bit mapping procedure according to the present embodiment when the modulation is 16 QAM and the code rate is ½. In this case, in all of the modulation symbols, the information bits $X_a'(i)$ are placed in bit positions where it is difficult for an error to occur. In addition, the parity bits $X_b'(j)$ are placed in one of the bit positions where it is easy for an error to occur, and the parity bits $X_c'(j)$ are placed at the other of the bit positions where it is easy for an error to occur.

[Case A3: the modulation is 16 QAM modulation, and the code rate is ⅔ (i.e., the number of information bits is more than the number of parity bits)].

Figure 14:
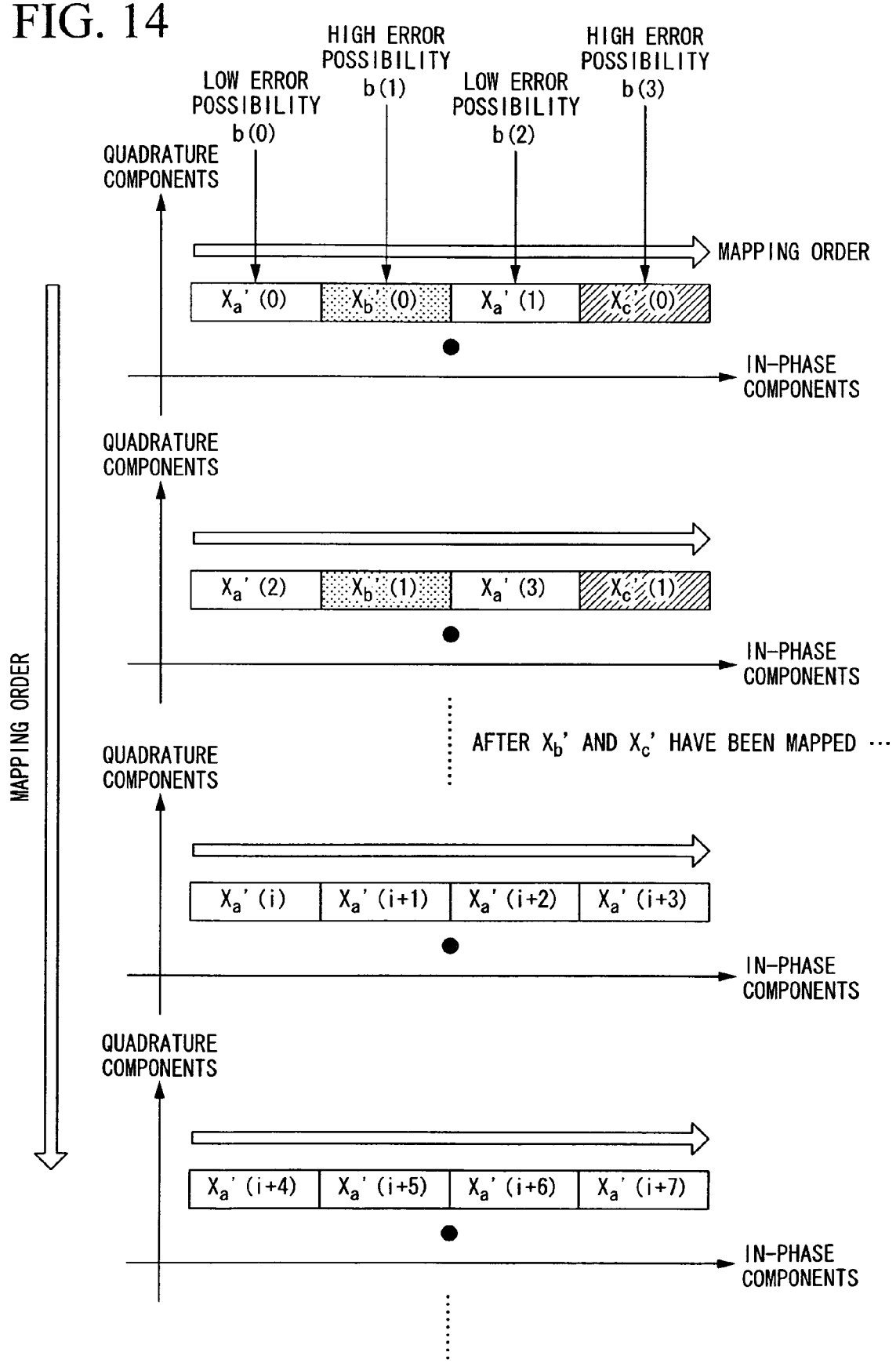
FIG. 14 is a conceptual view showing the bit mapping procedure according to the second embodiment of the present invention.

FIG. 14 is a conceptual view showing a bit mapping procedure according to the present embodiment when the modulation is 16 QAM and the code rate is ⅔. In this case, firstly, the information bits $X_a'(i)$ are placed in bit positions where it is difficult for an error to occur. In addition, the parity bits $X_b'(j)$ are placed in one of the bit positions where it is easy for an error to occur, and the parity bits $X_c'(j)$ are placed at the other of the bit positions where it is easy for an error to occur. After all the information bits have been positioned, the remaining parity bits $X_a'(j)$ are positioned in sequence.

Next, specific examples (i.e., case B1, case B2, and case B3) of when the 64 QAM symbol shown in FIG. 9 is used will be described.

[Case B1: the modulation is 64 QAM modulation, and the code rate is ⅓ (i.e., the number of information bits is less than the number of parity bits)].

Figure 15:
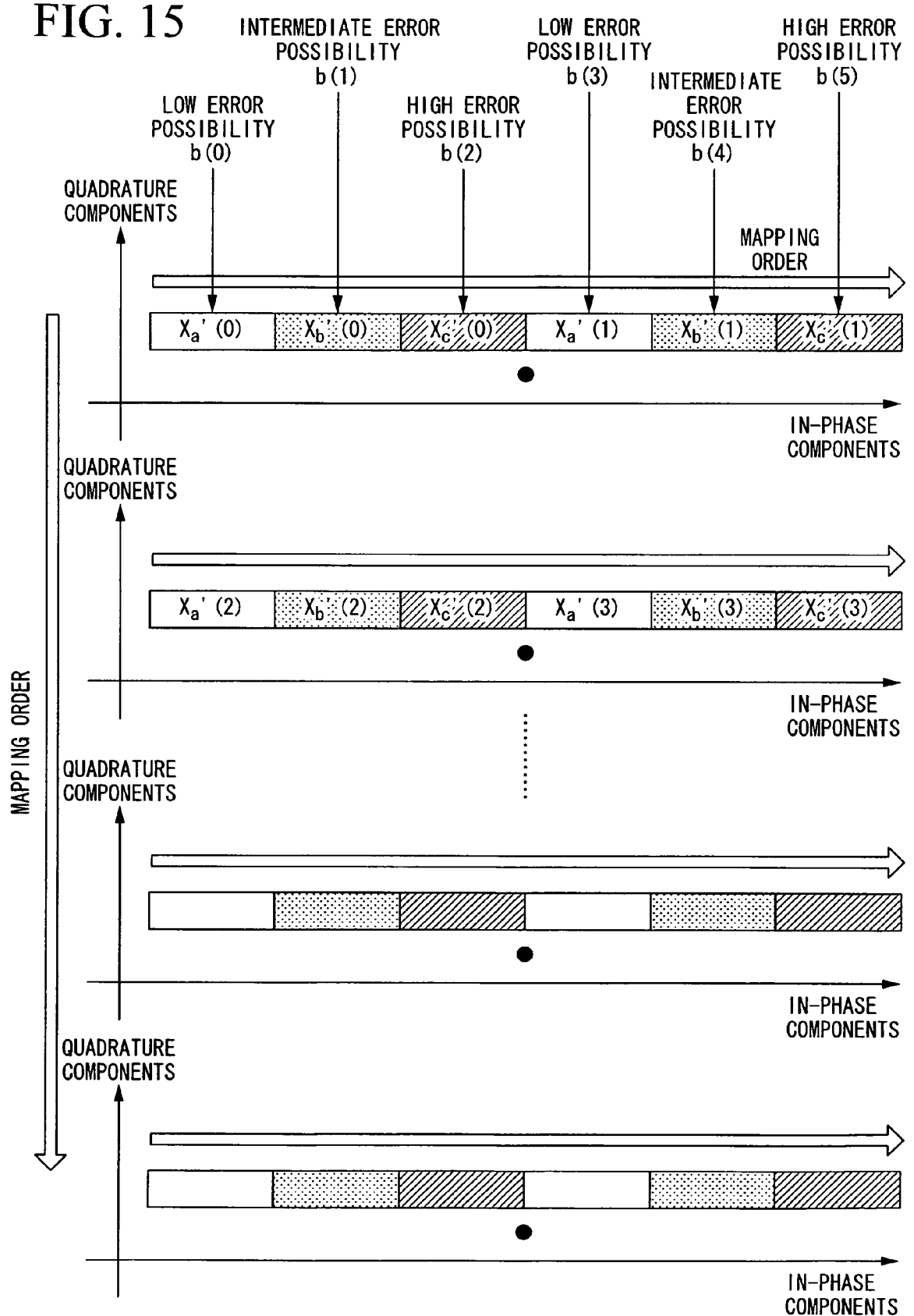
FIG. 15 is a conceptual view showing the bit mapping procedure according to the second embodiment of the present invention.

FIG. 15 is a conceptual view showing a bit mapping procedure according to the present embodiment when the modulation is 64 QAM and the code rate is ⅓. In this case, firstly, in all of the modulation symbols, the information bits $X_a'(i)$ are placed in bit positions where it is difficult for an error to occur. In addition, the parity bits $X_b'(j)$ are placed in bit positions where there is an intermediate likelihood of an error occurring, and the parity bits $X_c'(j)$ are placed in bit positions where it is easy for an error to occur.

[Case B2: the modulation is 64 QAM modulation, and the code rate is ½ (i.e., the number of information bits is the same as the number of parity bits)].

Figure 16:
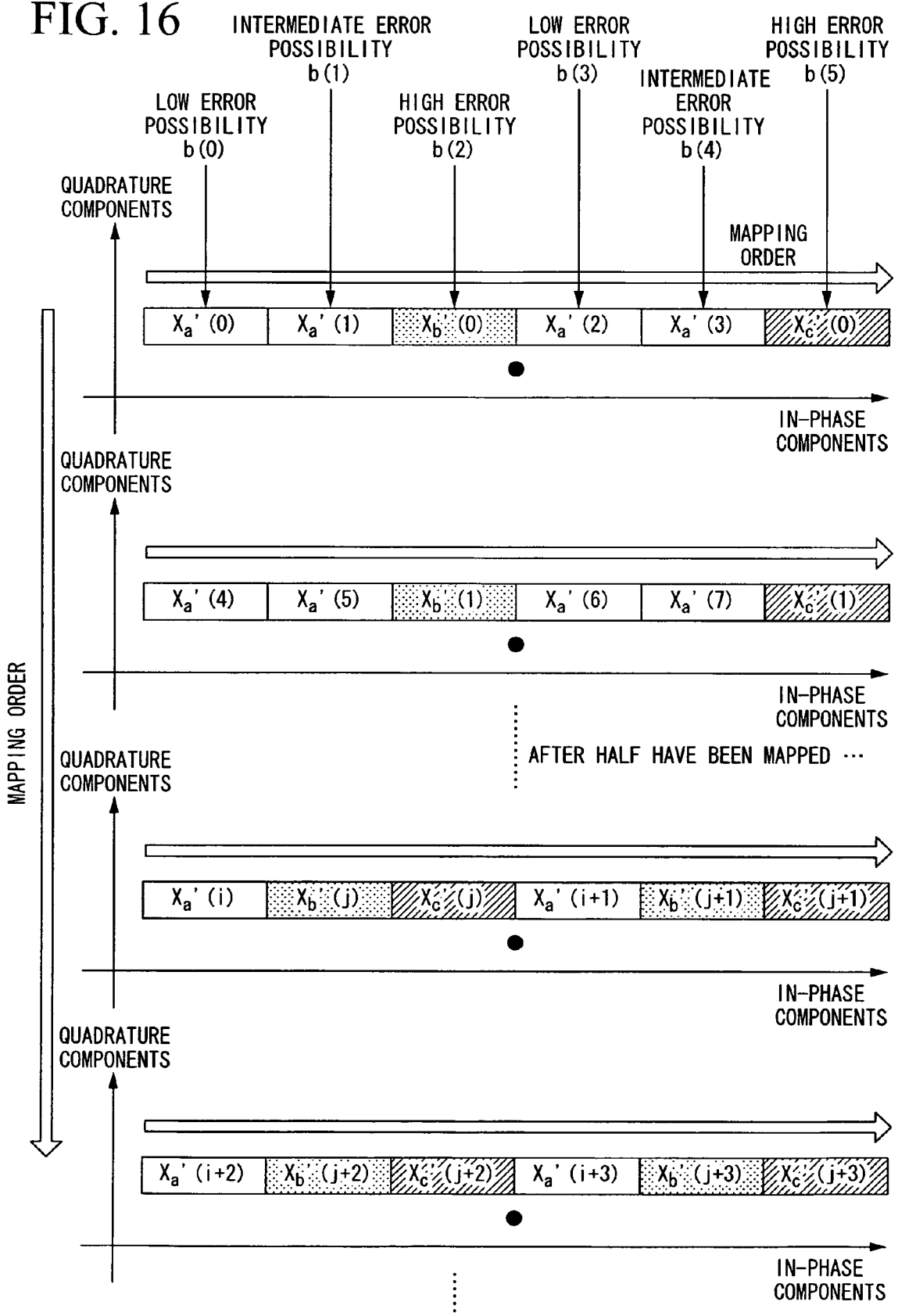
FIG. 16 is a conceptual view showing the bit mapping procedure according to the second embodiment of the present invention.

FIG. 16 is a conceptual view showing a bit mapping procedure according to the present embodiment when the modulation is 64 QAM and the code rate is ½. In this case, the information bits $X_a'(i)$ are placed in sequence in bit positions where it is difficult for an error to occur and in bit positions where there is an intermediate likelihood of an error occurring. In addition, the parity bits $X_b'(j)$ are placed in one of the bit positions where it is easy for an error to occur, and the parity bits $X_c'(j)$ are placed at the other of the bit positions where it is easy for an error to occur. After half of the modulation symbol has been mapped, the information bits $X_a'(i)$ are placed in bit positions where it is difficult for an error to occur, the parity bits $X_b'(j)$ are placed in bit positions where there is an intermediate likelihood of an error occurring, and the parity bits $X_c'(j)$ are placed in bit positions where it is easy for an error to occur.

[Case B3: the modulation is 64 QAM modulation, and the code rate is ⅔ (i.e., the number of information bits is more than the number of parity bits)].

Figure 17:
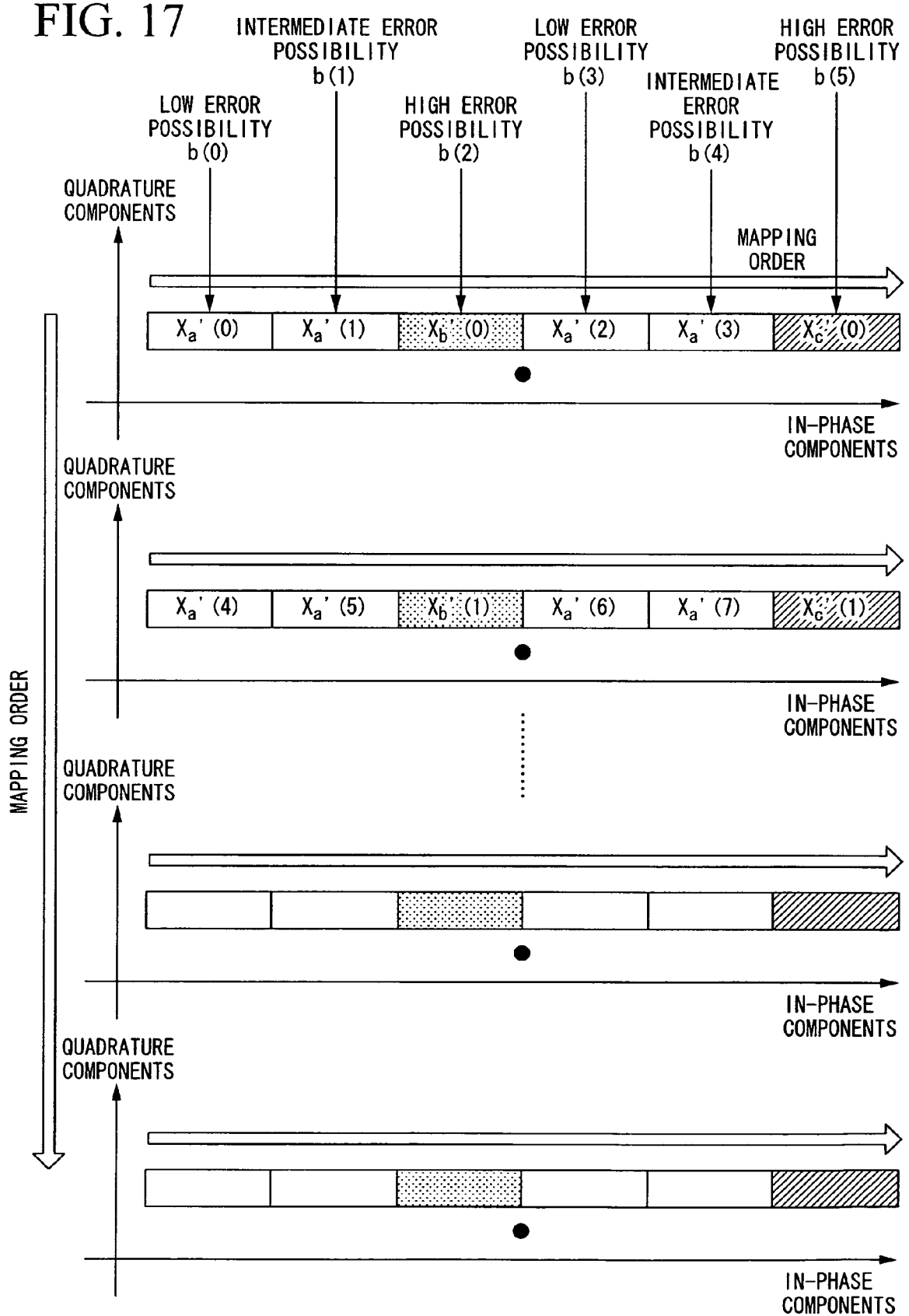
FIG. 17 is a conceptual view showing the bit mapping procedure according to the second embodiment of the present invention.

FIG. 17 is a conceptual view showing a bit mapping procedure according to the present embodiment when the modulation is 64 QAM and the code rate is ⅔. In this case, in all of the modulation symbols, the information bits $X_a'(i)$ are placed in sequence in bit positions where it is difficult for an error to occur and in bit positions where there is an intermediate likelihood of an error occurring. In addition, the parity bits $X_b'(j)$ are placed in one of the bit positions where it is easy for an error to occur, and the parity bits $X_c'(j)$ are placed at the other of the bit positions where it is easy for an error to occur.

According to the above described second embodiment of the present invention, it is possible to perform bit mapping onto multilevel modulation symbols that are suitable for twin turbo decoding.

Note that in the bit mapping method according to the present invention, various modifications to the Rules 1, 2, and 3 of the above described second embodiment are possible.

For example, it is also possible to comply with the following Rules (1) and (2);
(1) As the bit mapping order of priority, the information bits $X_a'(i)$ are taken first, then the parity bits $X_b'(i)$, and the parity bits $X_c'(i)$ are taken last.
(2) The bits are positioned such that a group made up of [information bit $X_a$, parity bit $X_b$, and parity bit $X_c$] are provided in one modulation symbol. More preferably, the same number of parity bits $X_b$ and parity bits $X_c$ are provided in one modulation symbol.

The second embodiment of the present invention has been described in detail above with reference made to the drawings, however, the specific structure thereof is not limited to this embodiment and various design modifications may be included therein insofar as they do not depart from the spirit or scope of the present invention.

For example, in the above described second embodiment, the description uses a twin turbo decoder as an example, however, the demodulator to which the present invention can be applied is not limited to a twin turbo decoder. The present invention can also be applied to various types of demodulator that have a feedback loop for stochastic coupling and provides the same effects with these demodulators.

Moreover, the multilevel modulation system to which the present invention can be applied is not limited to the above described 16 QAM and 64 QAM. The present invention can also be applied to other modulation systems provided that the modulation system is one that transmits two or more bits to each component (i.e., in-phase components or quadrature components) of a modulation symbol such as, for example, 256 QAM or ASK.

Third Embodiment

A third embodiment of the present invention will now be described.

Figure 18:
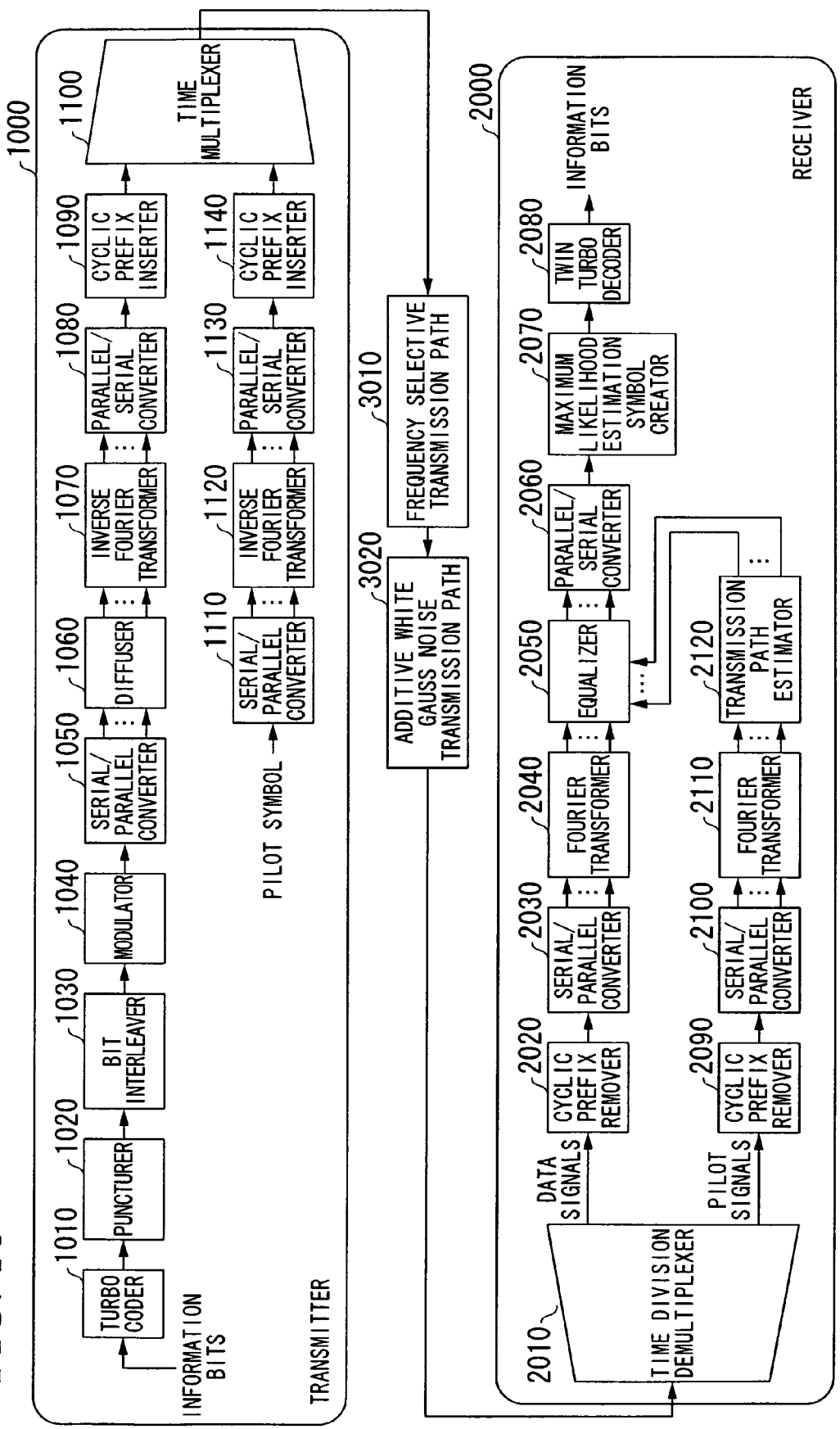
FIG. 18 is a block diagram showing the structure of a data transmission system according to a third embodiment of the present invention.

FIG. 18 is a block diagram showing the structure of a data transmission system according to a third embodiment of the present invention.

Figure 31:
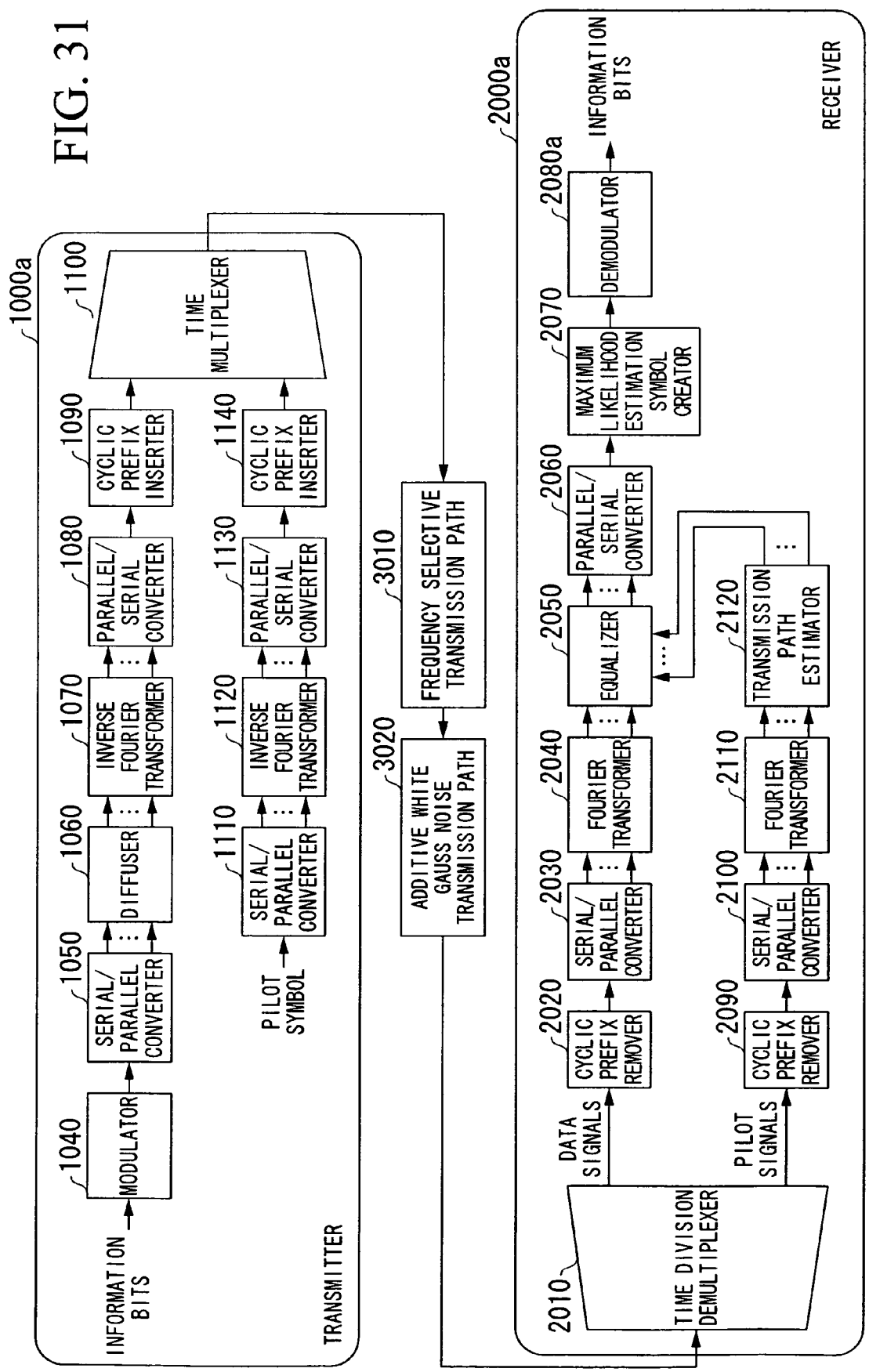
FIG. 31 is a block diagram showing the structure of an MC-CDMA data transmission system that estimates maximum likelihood without performing back-diffusion in the conventional technology.
Figure 32:
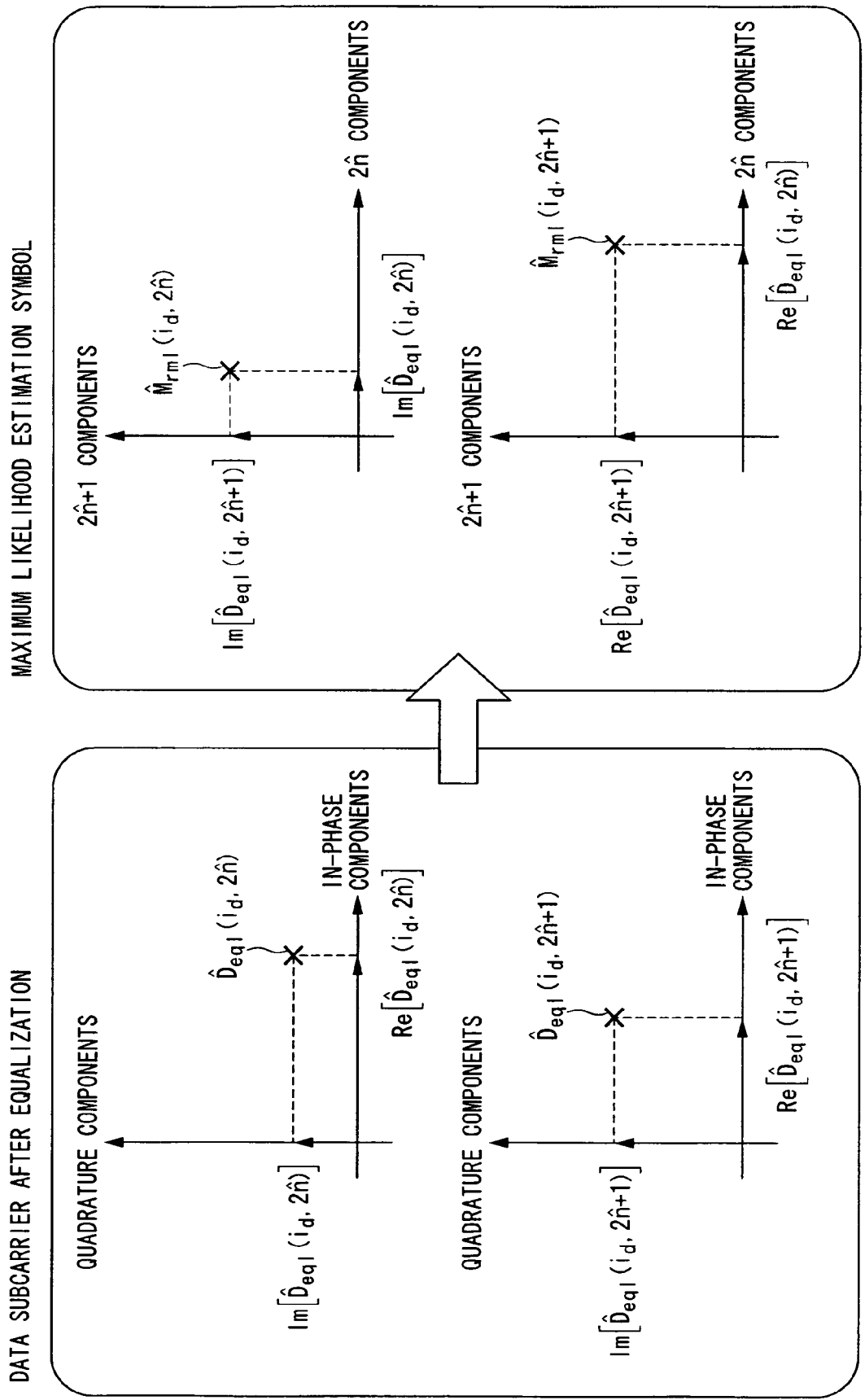
FIG. 32 is a view showing processing to create a symbol for maximum likelihood estimation when the diffusivity is 2 in the conventional technology.

The data transmission system shown in FIG. 18 is a multi-carrier code division multiple access (MC-CDMA) system, and is provided with a transmitter 1000. The transmitter 1000 transmits signals that have undergone turbo code encoding and multilevel modulation. The receiver 2000 performs maximum likelihood estimation without performing back-diffusion, and performs twin turbo decoding. Note that, in FIG. 18, portions that correspond to those in FIG. 31 are given the same symbols and a description thereof is omitted. Moreover, the structure of a turbo coder 1010 is the same as that shown in FIG. 11, and portions corresponding to those in FIG. 11 are given the same symbols.

In FIG. 18, the turbo coder 1010 performs turbo coding on an information bit vector $X_a$, and a parity bit vector $X_b$ is created by the element coder 1_111 shown in FIG. 11 and a parity bit vector $X_c$ is created by the element coder 2_111 shown in FIG. 11. Next, a puncturer 1020 creates a code sequence having an optional code rate by puncturing the parity bit vectors $X_b$ and $X_c$. Next, a bit interleaver 1030 performs bit interleaving. Next, a modulator 1040 modulates the coded bits which have undergone bit interleaving by mapping them to a modulation symbol in accordance with the bit mapping rules according to the present embodiment. After modulation, the signals are converted into parallel signals by a serial/parallel converter 1050. A diffuser 1060 diffuses and multiplexes these parallel signals so as to create a data sub-carrier. In the same way as in a conventional MC-CDMA system, this data sub-carrier is then converted into a serial signal by a parallel/serial converter 1080 after being subject to an inverse Fourier transform by an inverse Fourier transformer 1070. A cyclic prefix is then inserted by a cyclic prefix inserter 1090, and it is then further time multiplexed with a pilot signal by a time multiplexer 1100, and is then transmitted.

These transmission signals then receive transmission path variations and are received by the receiver 2000. The receiver 2000 then performs transmission path estimation and equalization processing from the received signals, and creates an equalized data sub-carrier. The equalized data sub-carrier then undergoes parallel/serial conversion, and is then converted into a maximum likelihood estimation symbol, and is demodulated by a twin turbo decoder 2080. The structure of the twin turbo decoder 2080 is the same as that shown in FIG. 29, and portions corresponding to those in FIG. 29 are described using the same symbols.

In the bit mapping method of the present embodiment, coded bits are mapped in accordance with the following Rules 1, 2, and 3 (i.e., order of priority).
(Rule 1) Information bits are placed in bit positions where it is difficult for an error to occur.
(Rule 2) The same number of parity bits that are created by the element coder 1_111 as the number of parity bits that are created by the element coder 2_111 are placed in the same maximum likelihood estimation symbol.
(Rule 3) Parity bits that are created by the element coder 1_111 are placed in bit positions where it is more difficult for an error to occur than the bit positions where parity bits created by the element coder 2_111 are placed.

Here, the reasons why the above described rules 1, 2, and 3 are employed are described.
[The Reason of Rule 1]
In the twin turbo decoder 2080, while the parity bit communication path value is used in just one of the element decoders 211, the information bit communication path value is used in both of the element decoders 1_111 and 2_111. Accordingly, information bits can be said to have a greater degree of importance than parity bits. Because of this, the signal-to-noise power ratio of the information bits can be improved by the above described Rule 1.

[The Reason of Rule 2]

In the twin turbo decoder 2080, the a-posteriori values of parity bits that are input into the demodulator 1_210 are only those created by the element decoder 2_211, and those created by the element decoder 1_211 are not input. In contrast, the a-posteriori values of the parity bits that are input into the demodulator 2_210 are only those created by the element decoder 1_211, and those created by the element decoder 2_211 are not input. Accordingly, if the parity bits created by any one of the element decoders 111 are consolidated in a single modulation symbol, then bits are generated in which the a-posteriori values of pair bits cannot be obtained in either one of the demodulators 1_210 and 2_210, and the communication path values of these bits are not updated. As a result of this, because the number of pair bits that it is possible to use in communication path value update processing is equal in both of the demodulators 1_210 and 2_210 due to the above described Rule 2, the accuracy of the updating of the communication path values in both demodulators 1_210 and 2_210 is uniformized.

[The Reason of Rule 3]

In the twin turbo decoder 2080, the number of communication path value updates of the demodulator 2_210 is one more than the number of updates for the demodulator 1_210. Accordingly, by improving the signal-to-noise power ratio of the communication path value of the parity bits input into the demodulator 2_210, the accuracy of the updating of the communication path values is improved. As a result of this, due to Rule 3, it is possible to improve the signal-to-noise power ratio of the parity bits created by the element coder 1_211.

A description will now be given of the bit mapping method of the present embodiment using specific examples. Note that, here, the constellation diagram of the QPSK (Quadrature Phase Shift Keying, Quadri-Phase Shift Keying) symbol shown in FIG. 19, the constellation diagram of the 16 QAM symbol shown in FIG. 3, and the constellation diagram of the 64 QAM symbol shown in FIG. 9 are used as examples.

In the constellation diagram of the 16 QAM symbol shown in FIG. 3, the bits b (0) and b (2) are in bit positions where it is difficult for an error to occur, while the bits b (1) and b (3) are in bit positions where it is easy for an error to occur.

In the constellation diagram of the 64 QAM symbol shown in FIG. 9, the bits b (0) and b (3) are in bit positions where it is difficult for an error to occur, while the bits b (2) and b (5) are in bit positions where it is easy for an error to occur. There is an intermediate likelihood of an error occurring in the bit positions b (1) and b (4) (i.e., these bit positions have a greater likelihood of an error occurring than the positions of the bits b (0) and b (3) and a lesser likelihood than the positions of the bits b (2) and b (5).

Moreover, the information bits in the i-th position after the bit interleaving are taken as $X_a'(i)$, the parity bits at the j-th position that are created by the element coder 1_111 after the bit interleaving are taken as $X_b'(j)$, and the parity bits at the j-th position that are created by the element coder 2_111 after the bit interleaving are taken as $X_c'(j)$.

Figure 19:
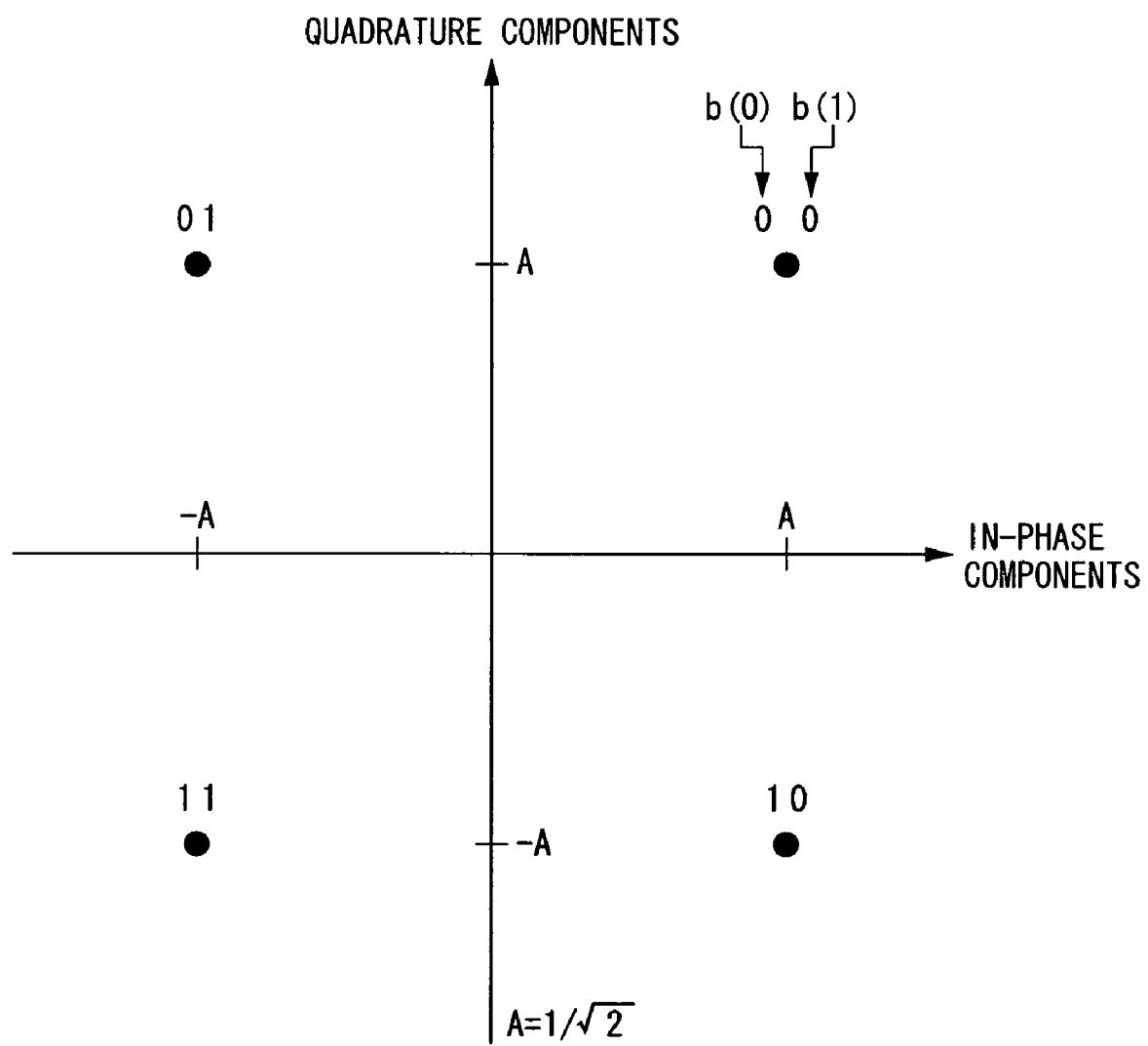
FIG. 19 is a view showing the constellation diagram of a QPSK symbol.

Firstly, specific examples (i.e., case A1, case A2, and case A3) of when the QPSK symbol shown in FIG. 19 is used will be described.

[Case A1: the modulation is QPSK modulation, and the code rate is ⅓ (i.e., the number of information bits is less than the number of parity bits)].

Figure 20:
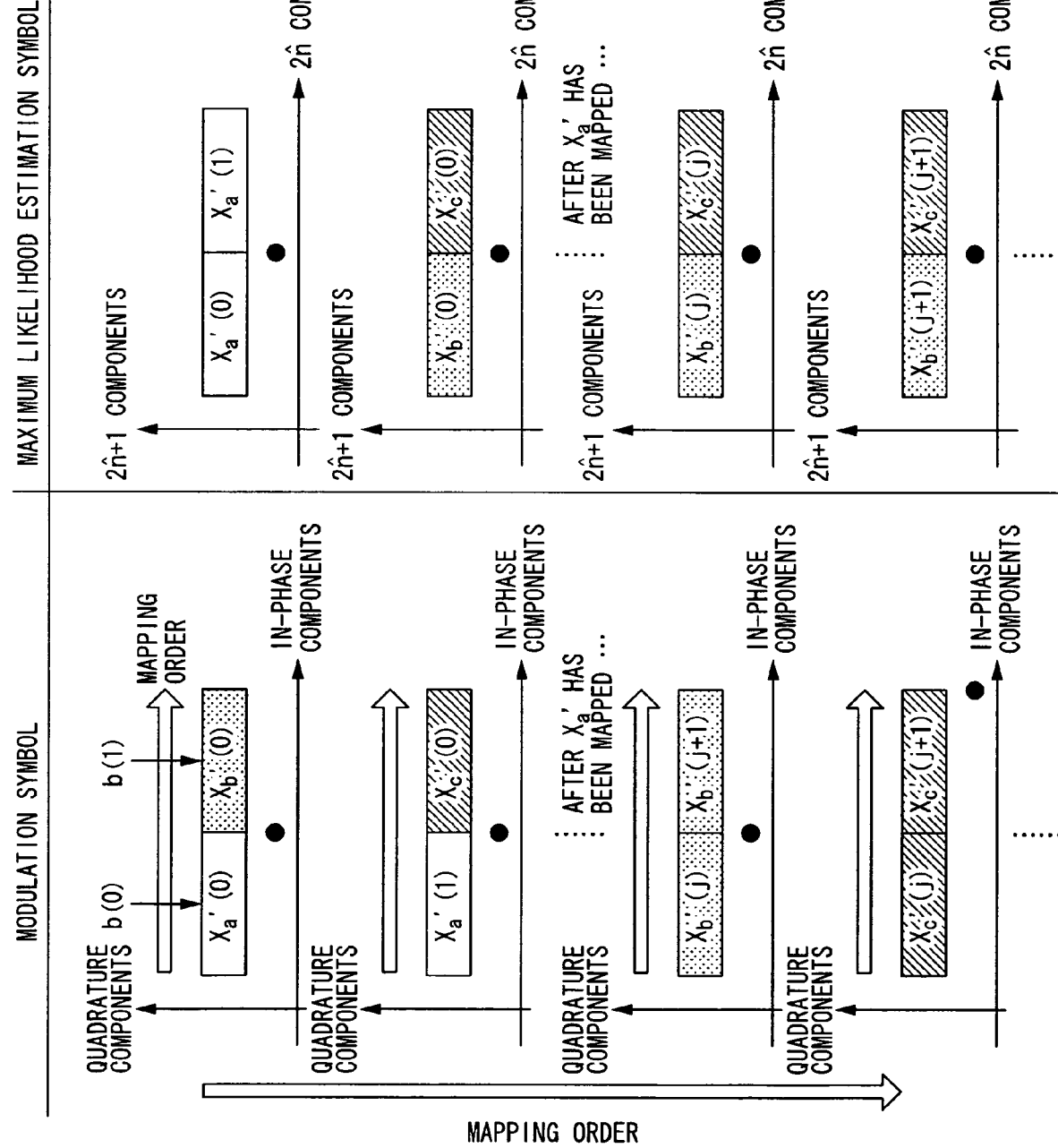
FIG. 20 is a conceptual view showing a bit mapping procedure according to the third embodiment of the present invention.

FIG. 20 is a conceptual view showing a bit mapping procedure according to the present embodiment when the modulation is QPSK and the code rate is ⅓. In this case, firstly, an information bit $X_a'(i)$ is placed in one of the bit positions, and a parity bit $X_b'(j)$ is placed in the other of the bit positions. Next, an information bit $X_a'(i)$ is placed in one of the bit positions, and a parity bit $X_c'(j)$ is placed in the other of the bit positions. This processing is repeated. After all the information bits have been positioned, a modulation symbol that is made up solely by parity bits $X_b'(j)$, and a modulation symbol that is made up solely by parity bits $X_c'(j)$ are alternately created.

[Case A2: the modulation is QPSK modulation, and the code rate is ½ (i.e., the number of information bits is the same as the number of parity bits)].

Figure 21:
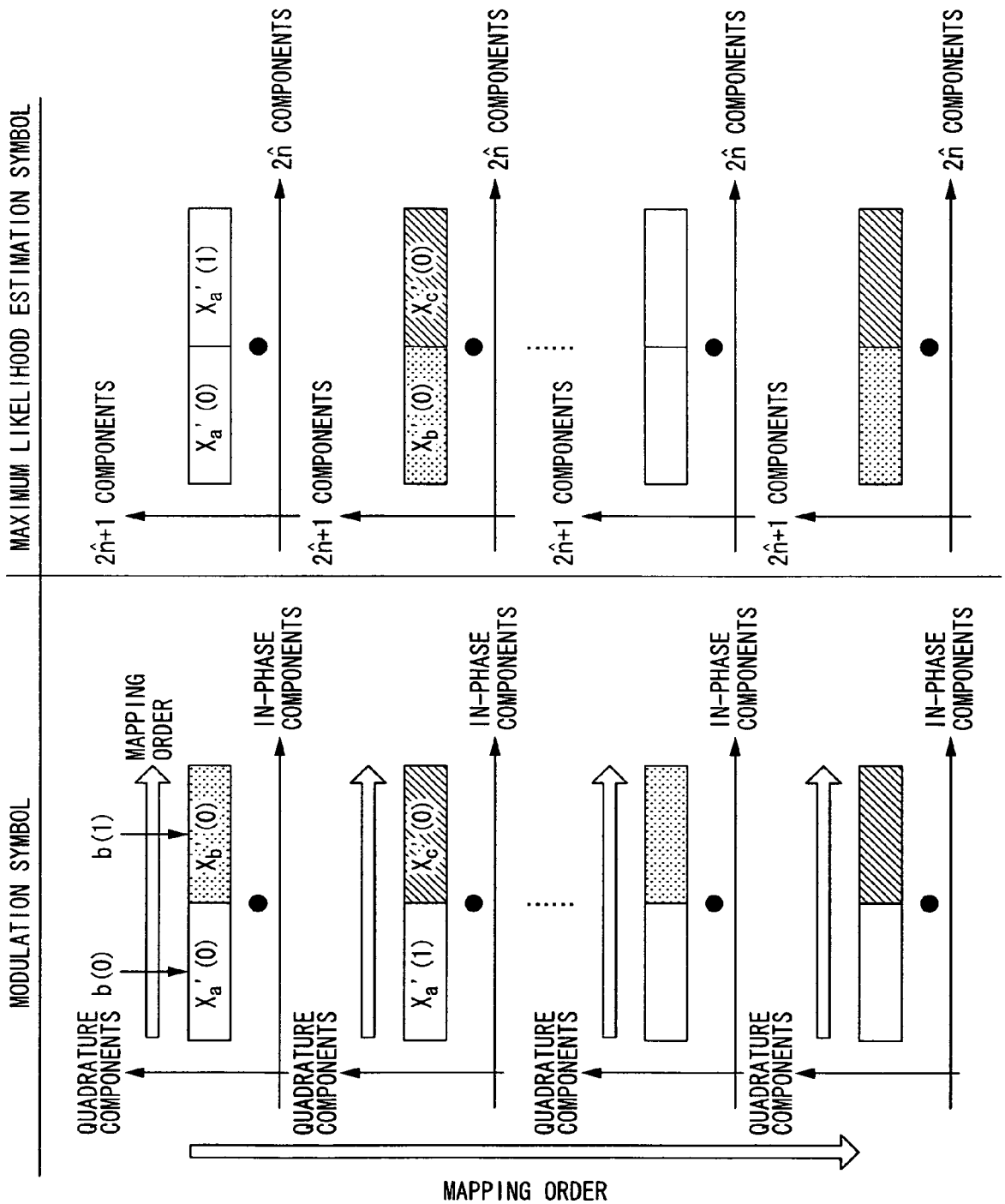
FIG. 21 is a conceptual view showing the bit mapping procedure according to the third embodiment of the present invention.

FIG. 21 is a conceptual view showing a bit mapping procedure according to the present embodiment when the modulation is QPSK and the code rate is ½. In this case, firstly, an information bit $X_a'(i)$ is placed in one of the bit positions, and a parity bit $X_b'(j)$ is placed in the other of the bit positions. Next, an information bit $X_a'(i)$ is placed in one of the bit positions, and a parity bit $X_c'(j)$ is placed in the other of the bit positions. This processing is subsequently repeated.

[Case A3: the modulation is QPSK modulation, and the code rate is ⅔ (i.e., the number of information bits is more than the number of parity bits)].

Figure 22:
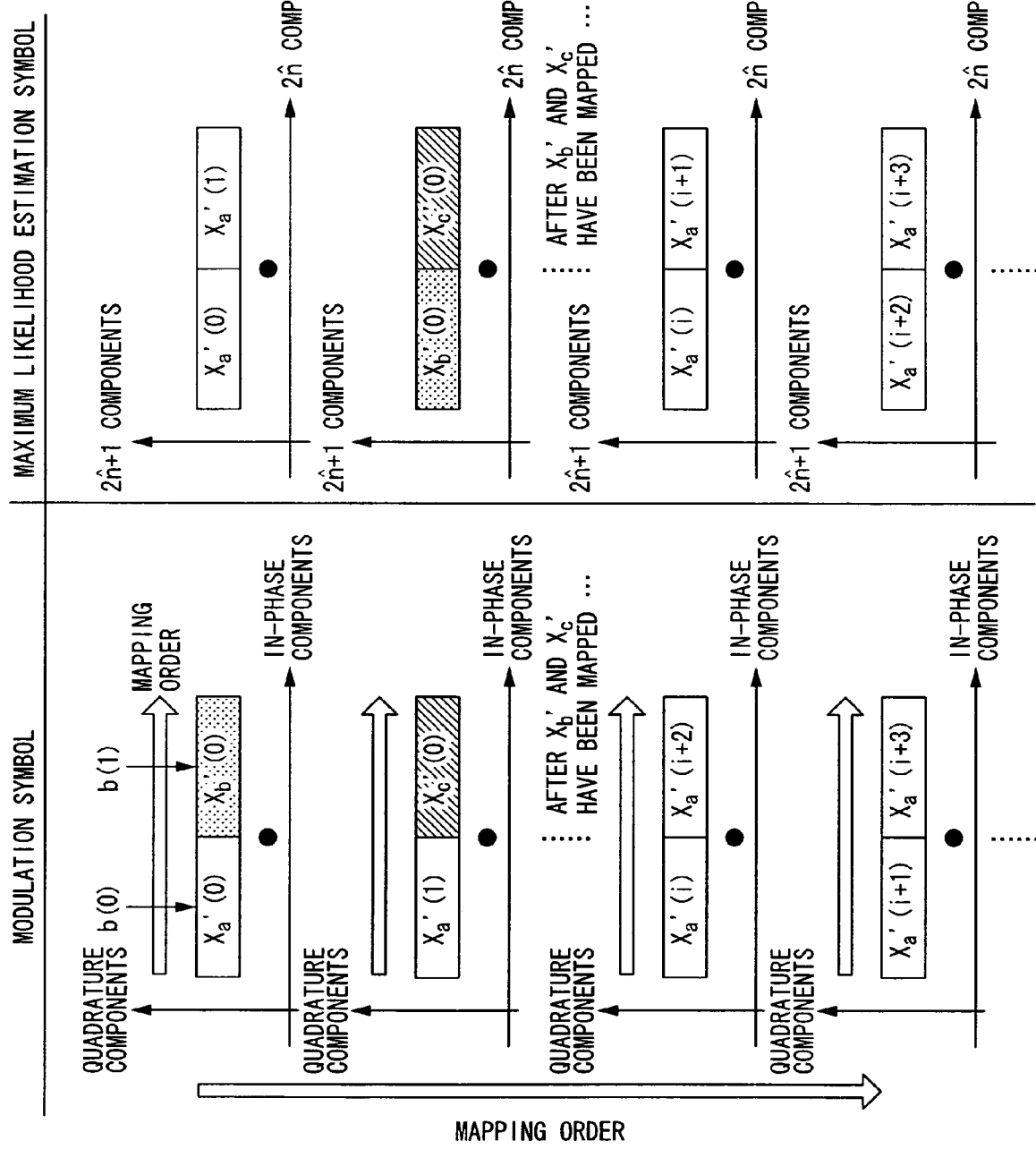
FIG. 22 is a conceptual view showing the bit mapping procedure according to the third embodiment of the present invention.

FIG. 22 is a conceptual view showing a bit mapping procedure according to the present embodiment when the modulation is QPSK and the code rate is ⅔. In this case, firstly, an information bit $X_a'(i)$ is placed in one of the bit positions, and a parity bit $X_b'(j)$ is placed in the other of the bit positions. Next, an information bit $X_a'(i)$ is placed in one of the bit positions, and a parity bit $X_c'(j)$ is placed in the other of the bit positions. This processing is repeated. After all the parity bits have been positioned, a modulation symbol that is made up solely by information bits $X_a'(i)$ is created.

Next, specific examples (i.e., case B1, case B2, and case B3) of when the 16 QAM symbol shown in FIG. 3 is used will be described.

[Case B1: the modulation is 16 QAM modulation, and the code rate is ⅓ (i.e., the number of information bits is less than the number of parity bits)].

Figure 23:
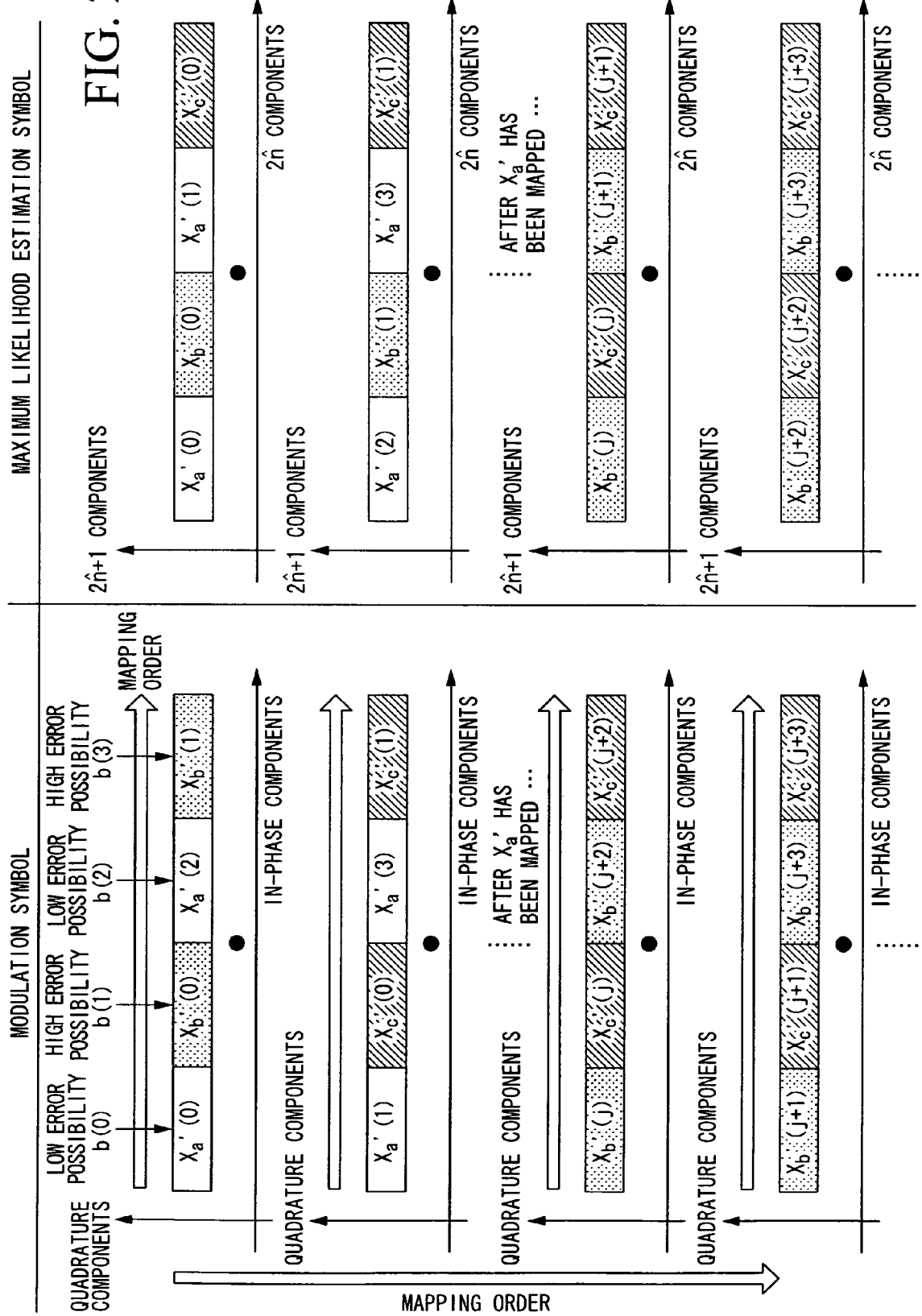
FIG. 23 is a conceptual view showing the bit mapping procedure according to the third embodiment of the present invention.

FIG. 23 is a conceptual view showing a bit mapping procedure according to the present embodiment when the modulation is 16 QAM and the code rate is ⅓. In this case, firstly, an information bit $X_a'(i)$ is placed in a bit position where it is difficult for an error to occur, and a parity bit $X_b'(j)$ is placed in a bit position where it is easy for an error to occur. Next, an information bit $X_a'(i)$ is placed in a bit position where it is difficult for an error to occur, and a parity bit $X_c'(j)$ is placed in a bit position where it is easy for an error to occur. This processing is repeated. After all the information bits have been positioned, the remaining parity bit $X_b'(j)$ is placed in a bit position where it is difficult for an error to occur, and the parity bit $X_c'(j)$ is placed in a bit position where it is easy for an error to occur.

[Case B2: the modulation is 16 QAM modulation, and the code rate is ½ (i.e., the number of information bits is the same as the number of parity bits)].

Figure 24:
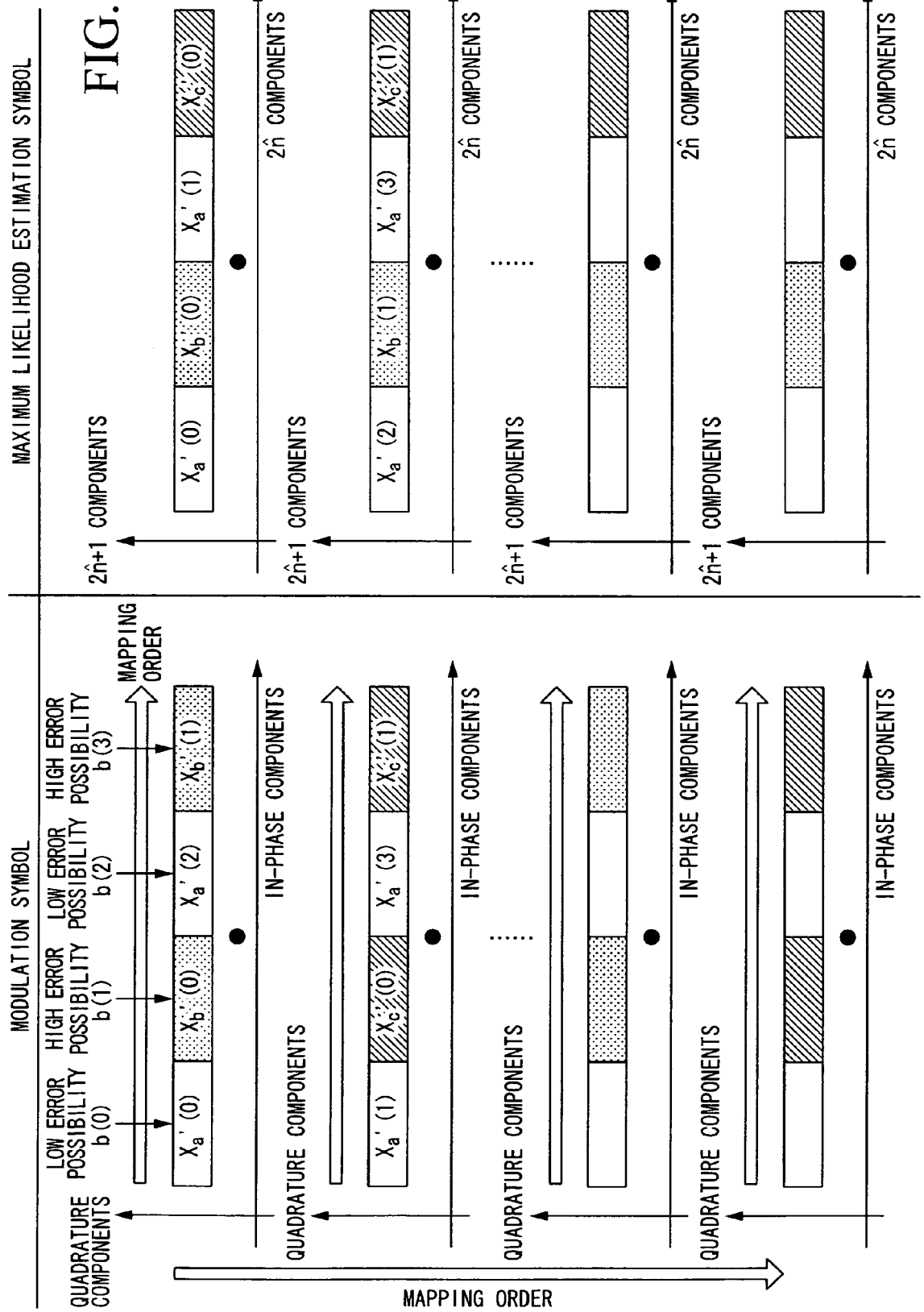
FIG. 24 is a conceptual view showing the bit mapping procedure according to the third embodiment of the present invention.

FIG. 24 is a conceptual view showing a bit mapping procedure according to the present embodiment when the modulation is 16 QAM and the code rate is ½. In this case, firstly, an information bit $X_a'(i)$ is placed in a bit position where it is difficult for an error to occur, and a parity bit $X_b'(j)$ is placed in a bit position where it is easy for an error to occur. Next, an information bit $X_a'(i)$ is placed in a bit position where it is difficult for an error to occur, and a parity bit $X_c'(j)$ is placed in a bit position where it is easy for an error to occur. This processing is subsequently repeated.

[Case B3: the modulation is 16 QAM modulation, and the code rate is ⅔ (i.e., the number of information bits is more than the number of parity bits)].

Figure 25:
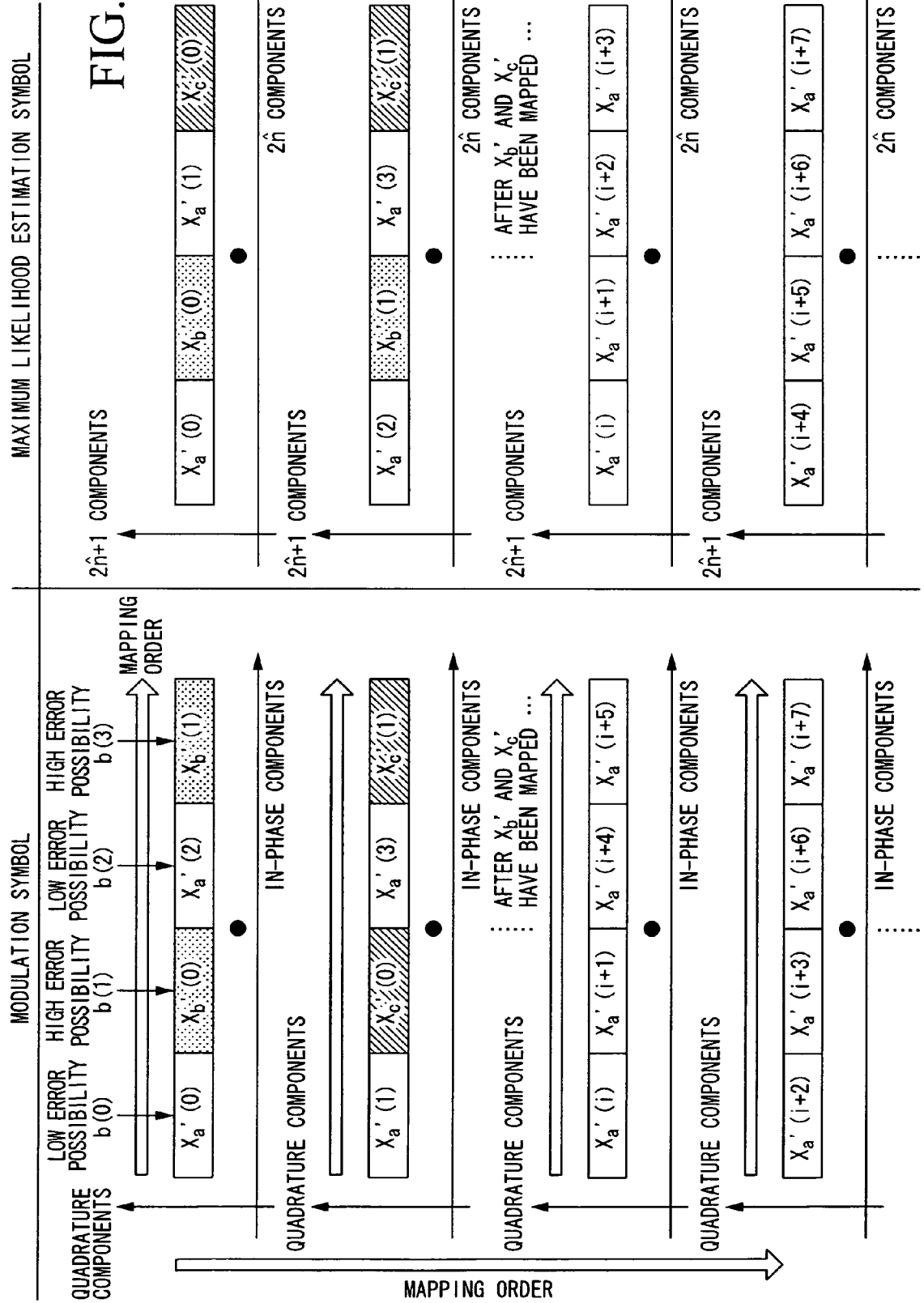
FIG. 25 is a conceptual view showing the bit mapping procedure according to the third embodiment of the present invention.

FIG. 25 is a conceptual view showing a bit mapping procedure according to the present embodiment when the modulation is 16 QAM and the code rate is ⅔. In this case, firstly, an information bit $X_a'(i)$ is placed in a bit position where it is difficult for an error to occur, and a parity bit $X_b'(j)$ is placed in a bit position where it is easy for an error to occur. Next, an information bit $X_a'(i)$ is placed in a bit position where it is difficult for an error to occur, and a parity bit $X_c'(j)$ is placed in a bit position where it is easy for an error to occur. This processing is repeated. After all the parity bits have been positioned, a modulation symbol that is made up solely by information bits $X_a'(i)$ is created.

Next, specific examples (i.e., case C1, case C2, and case C3) of when the 64 QAM symbol shown in FIG. 9 is used will be described.

[Case C1: the modulation is 64 QAM modulation, and the code rate is ⅓ (i.e., the number of information bits is less than the number of parity bits)].

Figure 26:
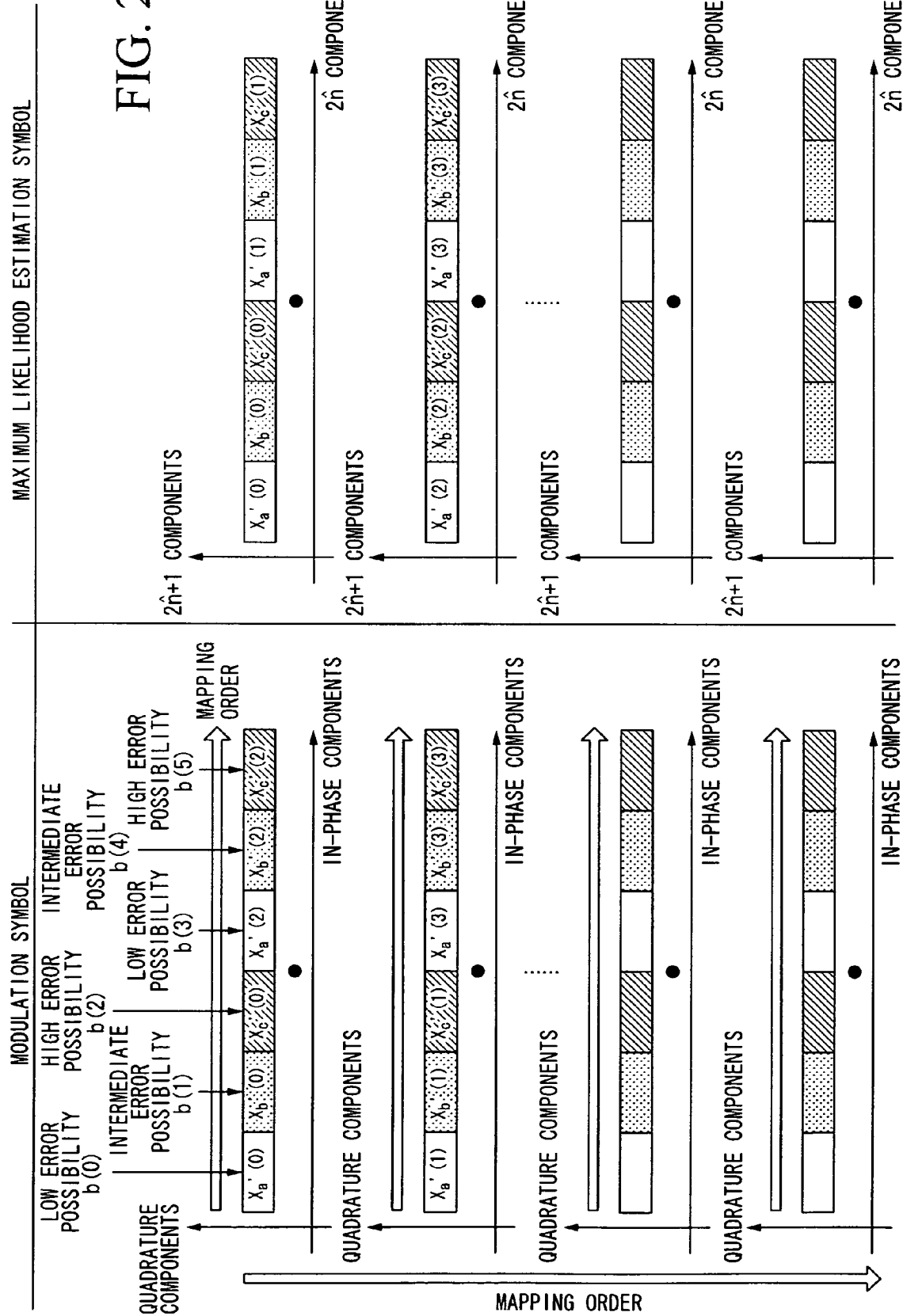
FIG. 26 is a conceptual view showing the bit mapping procedure according to the third embodiment of the present invention.

FIG. 26 is a conceptual view showing a bit mapping procedure according to the present embodiment when the modulation is 64 QAM and the code rate is ⅓. In this case, in all of the modulation symbols, the information bits $X_a'(i)$ are placed in bit positions where it is difficult for an error to occur. In addition, the parity bits $X_b'(j)$ are placed in bit positions where there is an intermediate likelihood of an error occurring, and the parity bits $X_c'(j)$ are placed in bit positions where it is easy for an error to occur.

[Case C2: the modulation is 64 QAM modulation, and the code rate is ½ (i.e., the number of information bits is the same as the number of parity bits)].

Figure 27:
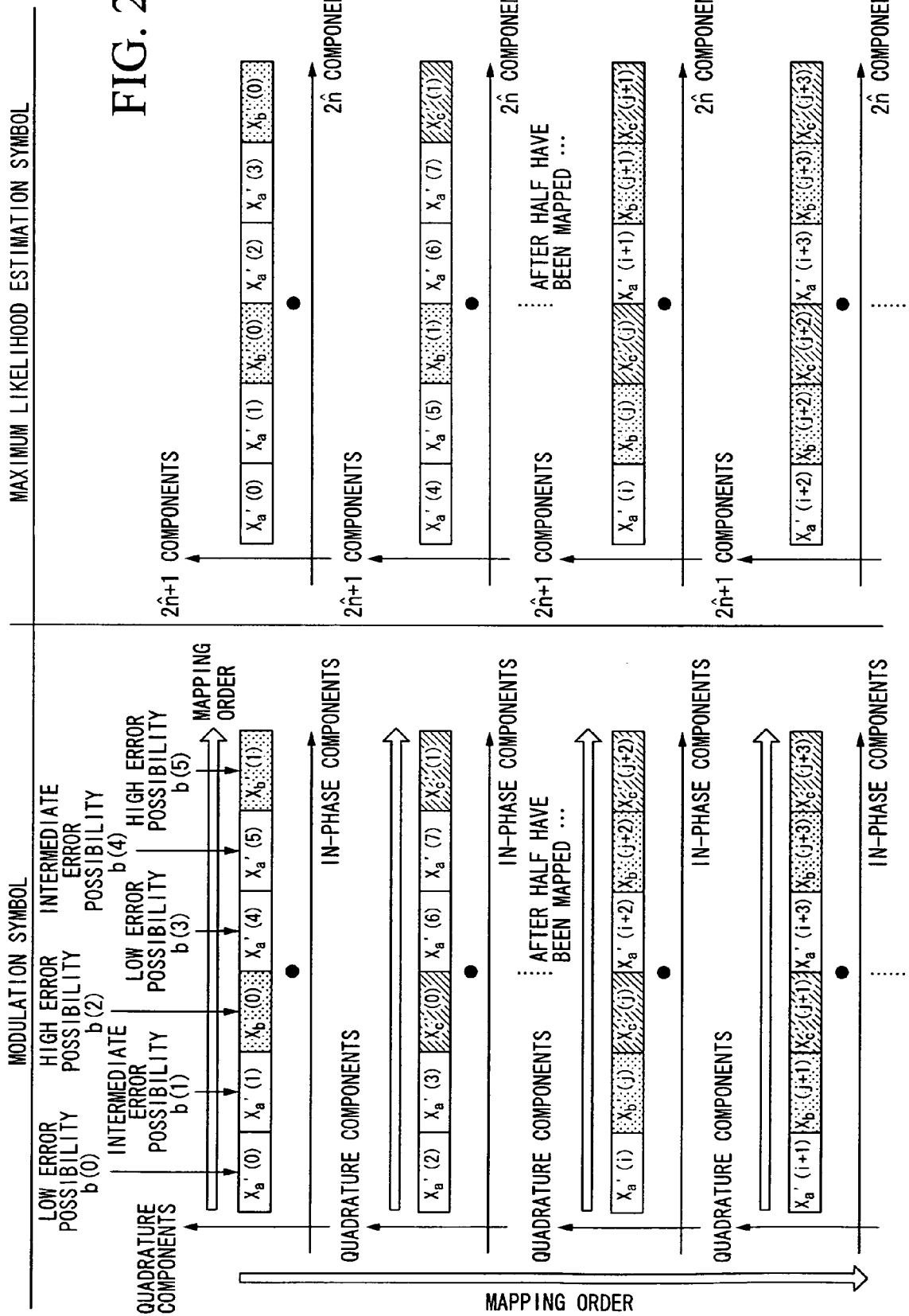
FIG. 27 is a conceptual view showing the bit mapping procedure according to the third embodiment of the present invention.

FIG. 27 is a conceptual view showing a bit mapping procedure according to the present embodiment when the modulation is 64 QAM and the code rate is ½. In this case, firstly, an information bit $X_a'(i)$ is placed in a bit position where it is difficult for an error to occur and in a bit position where there is an intermediate likelihood of an error occurring, and a parity bit $X_b'(j)$ is placed in a bit position where it is easy for an error to occur. Next, an information bit $X_a'(i)$ is placed in a bit position where it is difficult for an error to occur and in a bit position where there is an intermediate likelihood of an error occurring, and a parity bit $X_c'(j)$ is placed in a bit position where it is easy for an error to occur. This processing is repeated, and after half of the modulation symbol has been mapped, the information bits $X_a'(i)$ are placed in bit positions where it is difficult for an error to occur, the parity bits $X_b'(j)$ are placed in bit positions where there is an intermediate likelihood of an error occurring, and the parity bits $X_c'(j)$ are placed in bit positions where it is easy for an error to occur.

[Case C3: the modulation is 64 QAM modulation, and the code rate is ⅔ (i.e., the number of information bits is more than the number of parity bits)].

Figure 28:
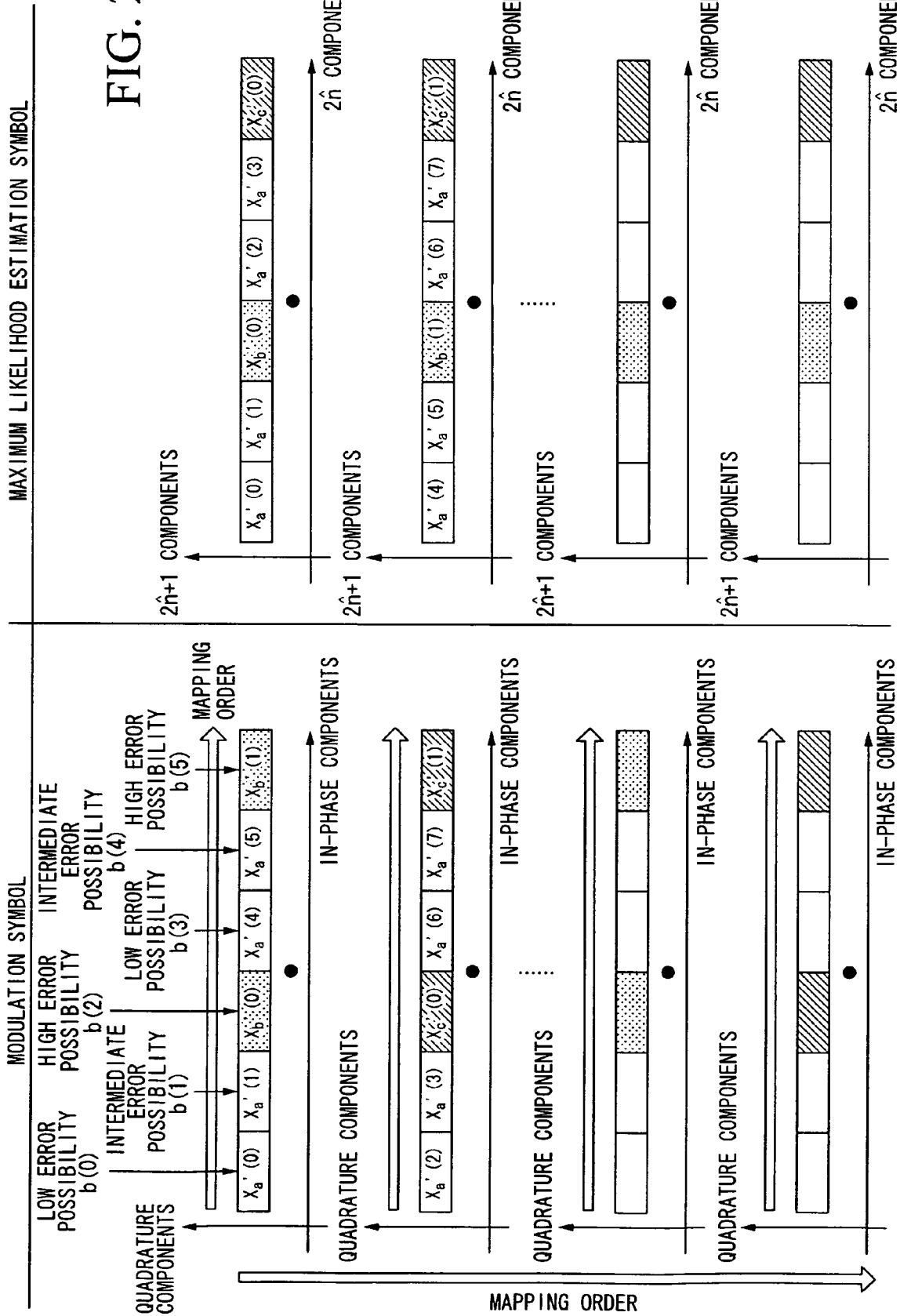
FIG. 28 is a conceptual view showing the bit mapping procedure according to the third embodiment of the present invention.

FIG. 28 is a conceptual view showing a bit mapping procedure according to the present embodiment when the modulation is 64 QAM and the code rate is ⅔. In this case, firstly, an information bit $X_a'(i)$ is placed in a bit position where it is difficult for an error to occur and in a bit position where there is an intermediate likelihood of an error occurring, and a parity bit $X_b'(j)$ is placed in a bit position where it is easy for an error to occur. Next, an information bit $X_a'(i)$ is placed in a bit position where it is difficult for an error to occur and in a bit position where there is an intermediate likelihood of an error occurring, and a parity bit $X_c'(j)$ is placed in a bit position where it is easy for an error to occur. This processing is subsequently repeated.

According to the above described third embodiment, in a multi-carrier code division multiple access system which uses turbo coding, it is possible to perform bit mapping onto multilevel modulation symbols that are suitable for cases in which maximum likelihood is estimated from reception signals without back-diffusion being performed and for cases in which twin turbo decoding is performed.

Note that in the bit mapping method according to the present invention, various modifications to the Rules 1, 2, and 3 of the above described third embodiment are possible.

For example, it is also possible to comply with the following Rules (1) and (2);
(1) As the bit mapping order of priority, the information bits $X_a'(i)$ are taken first, then the parity bits $X_b'(i)$, and the parity bits $X_c'(i)$ are taken last.
(2) The placement of the information bits $X_a$, parity bits $X_b$, and parity bits $X_c$ on a modulation symbol is made such that a group made up of [information bit $X_a$, parity bit $X_b$, and parity bit $X_c$] are provided in one maximum likelihood estimation symbol. More preferably, the same number of parity bits $X_b$ and parity bits $X_c$ are provided in one maximum likelihood estimation symbol.

The third embodiment of the present invention has been described in detail above with reference made to the drawings, however, the specific structure thereof is not limited to this embodiment and various design modifications may be included therein insofar as they do not depart from the spirit or scope of the present invention.

For example, in the above described third embodiment, the description uses a twin turbo decoder as an example, however, the demodulator to which the present invention can be applied is not limited to a twin turbo decoder. The present invention can also be applied to various types of demodulator that have a feedback loop for stochastic coupling and provides the same effects with these demodulators.

Moreover, in the above described third embodiment, the description uses as an example a forward link of a multi-carrier code division multiple access system which estimates maximum likelihood without performing back-diffusion, however, provided that it performs code diffusion, the present invention is not limited to an access system. For example, the present invention can also be applied to frequency division and time division access systems. Moreover, the present invention is not limited to a link direction.

Moreover, the present invention can also be applied to a single carrier transmission system. Moreover, the present invention can also be applied to a diffusivity which is greater than 2 and the same effects can also be obtained in this case.

Moreover, in the above described third embodiment, the description uses as an example a system in which a pilot signal is time division multiplexed with a data signal, however, the present invention can also be applied to a system in which a pilot signal is frequency division multiplexed with a data signal. Moreover, it is also possible for a single frame to be made up of a plurality of data MC-CDMA symbols. Moreover, the present invention can also be applied to equalization methods other than phase rotation compensation such as MMSE (Minimum Main Square Error) equalization and the like and the same effects can also be obtained in such cases.

Moreover, the multilevel modulation system that can be used in the present invention is not limited to the above-described QPSK, 16 QAM, and 64 QAM. The present invention can be applied to a variety of multilevel modulation systems such as for example, 256 QAM and ASK.

INDUSTRIAL APPLICABILITY

The present invention can be applied to a data transmission system that achieves bit mapping onto a multilevel modulation symbol which is suitable for demodulation having a feedback loop for stochastic coupling such as a twin turbo decoder.

What is claimed is:

1. A data transmission system that maps coded bits onto a modulation symbol using a multilevel modulation system and then transmits the same, wherein:
    there is provided a bit mapping means that maps the coded bits onto specific bit positions on the modulation symbol in accordance with the degree of importance of the coded bits;
    the bit mapping means maps coded bits that have a higher degree of importance onto bit positions of the modulation symbol where it is difficult for an error to occur; and
    the bit positions where it is difficult for an error to occur are obtained as being those bit positions where there is a higher probability of obtaining a longer least squares distance, in a constellation diagram of the multilevel modulation system, from a result of a calculation that an absolute value of the difference between a least squares distance between a signal point where reception is possible and a signal point having a bit position of 0, and a least squares distance between a signal point where reception is possible and a signal point having a bit position of 1 is calculated for all signal points where reception is possible.

2. The data transmission system according to claim 1, wherein the coded bits are low density parity check codes, and column weightings of check matrixes thereof are used for the degrees of importance.

3. The data transmission system according to claim 2, wherein information bits from among the coded bits have a greater degree of importance than parity bits among the code bits.

4. The data transmission system according to any one of claims 1, 2, or 3, wherein the multilevel modulation system transmits two or more bits of the in-phase components or quadrature components of the modulation symbol.

5. A data transmission method in which coded bits are mapped onto a modulation symbol by a multilevel modulation system and are then transmitted, wherein:
    the coded bits are mapped onto specific bit positions on the modulation symbol in accordance with the degree of importance of the coded bits;
    the coded bits that have a higher degree of importance are mapped onto bit positions of the modulation symbol where it is difficult for an error to occur; and
    the bit positions where it is difficult for an error to occur are obtained as being those bit positions where there is a higher probability of obtaining a longer least squares distance, in a constellation diagram of the multilevel modulation system, from a result of a calculation that an absolute value of the difference between a least squares distance between a signal point where reception is possible and a signal point having a bit position of 0, and a least squares distance between a signal point where reception is possible and a signal point having a bit position of 1 is calculated for all signal points where reception is possible.

6. The data transmission system according to claim 1, wherein the bit mapping means has:
    means for rearranging the coded bits in order of the greatest degree of importance; and
    means for placing the rearranged coded bits in sequence from the bit position of the modulation symbol where it is difficult for an error to occur of the modulation symbol.

* * * * *